US012354882B2

(12) United States Patent
Tsao et al.

(10) Patent No.: US 12,354,882 B2
(45) Date of Patent: Jul. 8, 2025

(54) SEMICONDUCTOR STRUCTURE AND METHOD FOR FORMING THE SAME

(71) Applicant: MEDIATEK INC., Hsinchu (TW)

(72) Inventors: Po-Chao Tsao, Hsinchu (TW); Hsien-Hsin Lin, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 388 days.

(21) Appl. No.: 18/067,886

(22) Filed: Dec. 19, 2022

(65) Prior Publication Data

US 2023/0223276 A1 Jul. 13, 2023

Related U.S. Application Data

(60) Provisional application No. 63/297,267, filed on Jan. 7, 2022.

(51) Int. Cl.
*H01L 21/48* (2006.01)
*H01L 21/02* (2006.01)
(Continued)

(52) U.S. Cl.
CPC ...... *H01L 21/481* (2013.01); *H01L 21/02293* (2013.01); *H01L 21/02362* (2013.01);
(Continued)

(58) Field of Classification Search
None
See application file for complete search history.

(56) References Cited

U.S. PATENT DOCUMENTS

| 10,586,765 B2 | 3/2020 | Smith et al. |
| 11,444,166 B2 | 9/2022 | Glass et al. |
| (Continued) | | |

FOREIGN PATENT DOCUMENTS

| TW | 201814841 A | 4/2018 |
| TW | 202101760 A | 1/2021 |
| TW | 202141655 A | 11/2021 |

OTHER PUBLICATIONS

Chinese language office action dated Aug. 30, 2023, issued in application No. TW 112100621.

*Primary Examiner* — Alexander G Ghyka
(74) *Attorney, Agent, or Firm* — McClure, Qualey & Rodack, LLP

(57) ABSTRACT

A semiconductor structure is provided. The semiconductor structure includes an insulator layer, first and second field-effect transistor devices, an isolation field-effect transistor device, front-side gate and back-side gate contacts. Each of the first and second field-effect transistor devices and the isolation field-effect transistor device includes a fin structure and first and second epitaxial source/drain structures. The fin structure includes channel layers and a gate structure that is wrapped around the channel layers. The first and second epitaxial source/drain structures are connected to opposite sides of the channel layers. The isolation field-effect transistor device is kept in the off-state. The front-side gate contact is formed on the first field-effect transistor device and electrically connected to the gate structure of the first field-effect transistor device. The back-side gate contact is formed passing through the insulator layer and electrically connected to the gate structure of the isolation field-effect transistor device.

42 Claims, 15 Drawing Sheets

(51) Int. Cl.
  *H01L 21/04* (2006.01)
  *H01L 21/762* (2006.01)
  *H01L 21/768* (2006.01)
  *H10D 62/13* (2025.01)
(52) U.S. Cl.
  CPC ...... *H01L 21/045* (2013.01); *H01L 21/76243* (2013.01); *H01L 21/76814* (2013.01); *H01L 21/76829* (2013.01); *H10D 62/151* (2025.01)

(56) References Cited

U.S. PATENT DOCUMENTS

| | | |
|---|---|---|
| 11,522,048 B2 | 12/2022 | Bomberger et al. |
| 11,810,917 B2 | 11/2023 | Chiu et al. |
| 2018/0061766 A1* | 3/2018 | Goktepeli ......... H01L 21/76898 |
| 2021/0242322 A1 | 8/2021 | Liang et al. |
| 2021/0343639 A1* | 11/2021 | Wang ............... H01L 21/76897 |
| 2021/0375686 A1 | 12/2021 | Kao et al. |
| 2023/0170352 A1* | 6/2023 | Bao ..................... H10D 84/856 257/351 |
| 2023/0420458 A1* | 12/2023 | Rubin ................ H10D 84/0186 |
| 2024/0072050 A1* | 2/2024 | Li ..................... H10D 84/0186 |

\* cited by examiner

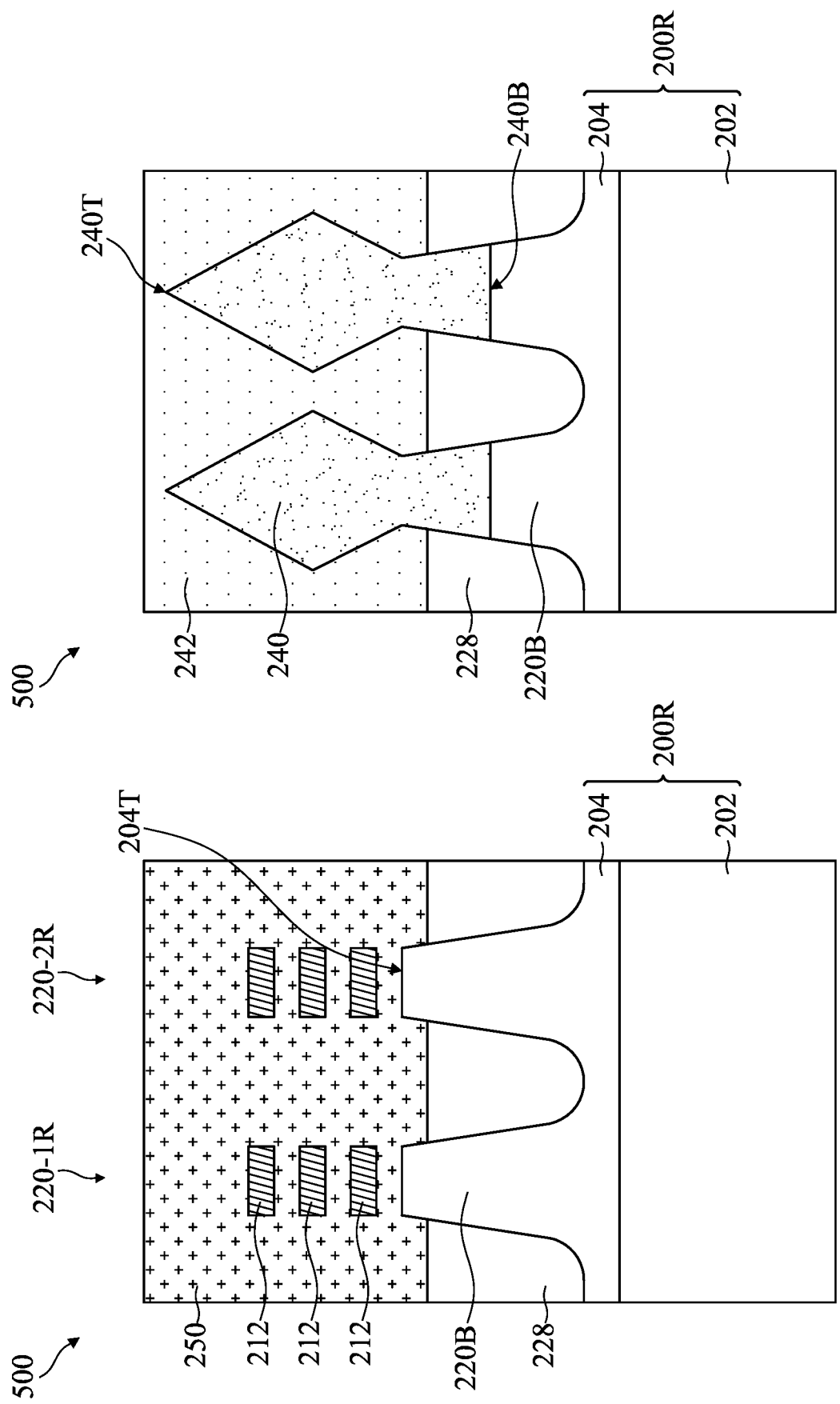

SEMICONDUCTOR STRUCTURE AND METHOD FOR FORMING THE SAME

CROSS REFERENCE TO RELATED APPLICATIONS

This application claims the benefit of U.S. Provisional Application No. 63/297,267, filed on Jan. 7, 2022, the entirety of which is incorporated by reference herein.

BACKGROUND OF THE INVENTION

Field of the Invention

The present invention is related to a semiconductor structure and method for forming the same, and in particular it is related to a fin field-effect transistor with reduced substrate leakage and improved device density and a method for forming the same.

Description of the Related Art

In recent years, advanced integrated circuit (IC) devices have become increasingly multifunctional and have been scaled down in terms of size. Although the scaling-down process generally increases production efficiency and lowers associated costs, it has also increased the complexity of processing and manufacturing IC devices. For example, Fin Field-Effect Transistors (FinFETs) have been introduced to replace planar transistors. Among these FinFETs, gate-all-around (GAA) structures such as nanosheet metal-oxide-semiconductor field-effect transistors (MOSFET) with excellent electrical characteristics have been developed. These characteristics include improved power performance and better area-scaling than what is available using current FinFET technologies.

Although existing semiconductor structures including nanosheet transistors and methods for manufacturing the same have been adequate for their intended purposes, they have not been entirely satisfactory in all respects. For example, extra implant processes are required to implant desired dopants into the bottom of the gate structure of GAA structures landing on the substrate to reduce substrate leakage. In addition, there is extra area for the isolation feature, which is disposed between the nanosheet transistors, and the functional circuit routings may result in low device density.

Thus, a novel semiconductor device is desirable to improve the substrate leakage problem and an improved device density.

BRIEF SUMMARY OF THE INVENTION

An embodiment of the present invention provides a semiconductor structure. The semiconductor structure includes an insulator layer, a first field-effect transistor device, a second field-effect transistor device and an isolation field-effect transistor device between the first field-effect transistor device and the second field-effect transistor device formed on the insulator layer, a front-side gate contact and a back-side gate contact. Each of the first field-effect transistor device, the second field-effect transistor device and the isolation field-effect transistor device includes a fin structure, a first epitaxial source/drain structure and a second epitaxial source/drain structure. The fin structure includes channel layers and a gate structure that is wrapped around the channel layer. The first epitaxial source/drain structure and the second epitaxial source/drain structure are connected to opposite sides of the channel layers, wherein the isolation field-effect transistor device is kept in an off-state. The front-side gate contact is formed on the first field-effect transistor device opposite the insulator layer, wherein the front-side gate contact is electrically connected the gate structure of the first field-effect transistor device. The back-side gate contact is formed passing through the insulator layer and electrically connected to the gate structure of the isolation field-effect transistor device.

In addition, an embodiment of the present invention provides a semiconductor structure. The semiconductor structure includes a first field-effect transistor device and a second field-effect transistor device disposed side-by-side, an isolation field-effect transistor device, an insulator layer, an interlayer dielectric (ILD) layer, a back-side gate contact and a front-side source/drain contact. Each of the first field-effect transistor device, the second field-effect transistor device and the isolation field-effect transistor device includes a fin structure, a first epitaxial source/drain structure and a second epitaxial source/drain structure. The fin structure including channel layers and a gate structure that is wrapped around the channel layer. The first epitaxial source/drain structure and the second epitaxial source/drain structure are connected to opposite sides of the channel layers. The insulator layer has a top surface in contact with a bottom portion of the gate structure of each of the first field-effect transistor device and the second field-effect transistor device. The interlayer dielectric (ILD) layer is disposed on a top portion of the gate structure of each of the first field-effect transistor device and the second field-effect transistor device. The back-side gate contact is formed passing through the insulator layer and electrically connected to the bottom portion of the gate structure of the isolation field-effect transistor device. The front-side source/drain contact is formed passing through the interlayer dielectric (ILD) layer and electrically connected to the first epitaxial source/drain structure or the second epitaxial source/drain structure of the isolation field-effect transistor device.

Furthermore, an embodiment of the present invention provides a method for forming a semiconductor structure. The method includes providing a substrate having a substrate layer and an insulator layer on the substrate layer. The method includes forming a first field-effect transistor device, a second field-effect transistor device and an isolation field-effect transistor device between the first field-effect transistor device and the second field-effect transistor device and directly on the insulator layer. Each of the first field-effect transistor device, the second field-effect transistor device and the isolation field-effect transistor device includes a fin structure, a first epitaxial source/drain structure and a second epitaxial source/drain structure. The fin structure including channel layers and a gate structure) that is wrapped around the channel layer. The first epitaxial source/drain structure and the second epitaxial source/drain structure are connected to opposite sides of the channel layers, wherein the isolation field-effect transistor device is kept in an off-state. The method includes forming a front-side gate contact formed on the first field-effect transistor device opposite the insulator layer, wherein the front-side gate contact is electrically connected the gate structure of the first field-effect transistor device. The method includes removing the substrate layer from the insulator layer. The method includes forming a back-side gate contact passing through the insulator layer and electrically connected to the gate structure of the isolation field-effect transistor device.

BRIEF DESCRIPTION OF THE DRAWINGS

The present invention can be more fully understood by reading the subsequent detailed description and examples with references made to the accompanying drawings, wherein:

FIG. 7A illustrates a cross-sectional view of an intermediate stage of forming the semiconductor structure shown along line A-A' in FIG. 5 in accordance with some embodiments;

FIG. 7B illustrates a cross-sectional view of an intermediate stage of forming the semiconductor structure shown along line B-B' in FIG. 5 in accordance with some embodiments;

DETAILED DESCRIPTION OF THE INVENTION

Figure 1A:
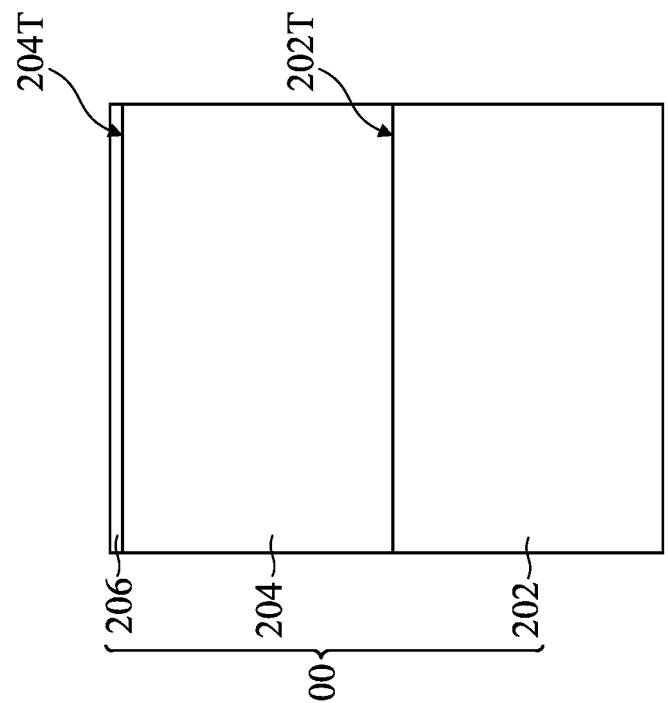
FIG. 1A illustrates a cross-sectional view of an intermediate stage of forming the semiconductor structure shown along line A-A' in FIG. 1 in accordance with some embodiments.

The following description is made for the purpose of illustrating the general principles in accordance with some embodiments of the disclosure and should not be taken in a limiting sense. The scope in accordance with some embodiments of the disclosure is best determined by reference to the appended claims.

The inventive concept is described fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments and may be implemented in various forms. Accordingly, the exemplary embodiments are provided only to disclose the inventive concept and let those skilled in the art know the category of the inventive concept. Also, the drawings as illustrated are only schematic and are non-limiting. In the drawings, the size of some of the elements may be exaggerated for illustrative purposes and not drawn to scale. The dimensions and the relative dimensions do not correspond to actual dimensions in the practice in accordance with some embodiments of the disclosure.

Embodiments provide a semiconductor structure including field-effect transistor devices, such as fin field-effect transistors (FinFETs) comprising a gate-all around transistor (GAA) device. Each of the field-effect transistor devices includes a fin structure formed on a semiconductor-on-insulator (SOI) substrate comprising a top semiconductor layer of first semiconductor atoms (e.g. silicon (Si)), a middle insulator layer, and a bottom substrate layer. Before forming a stack of alternating channel layers and sacrificial layers of the fin structure, an epitaxially growth process of a semiconductor capping layer containing the first semiconductor atoms and second semiconductor atoms (e.g. germanium (Ge)) and a subsequent thermal process are performed to drive second semiconductor atoms of the semiconductor capping layer into the top semiconductor layer, allowing the semiconductor capping layer and the top semiconductor layer collectively form another sacrificial layer having a composition (e.g. the Ge concentration (atomic percent)) that is similar to, or the same as, the composition of sacrificial layers in the stack of alternating channel layers and sacrificial layers of the fin structure. The sacrificial layers, which are formed from both the top semiconductor layer and the stack of alternating channel layers and sacrificial layers, are then replaced with a gate structure wrapping the channel layers. The gate structure and epitaxial source/drain structures of the field-effect transistor device can be directly formed on the middle insulator layer of the SOI substrate without being in contact with any semiconductor layer except for channel layers of the fin structure. Therefore, the substrate leakage problem can be improved without extra dopants implanted into bottoms of the gate structure and epitaxial source/drain structures.

In addition, the semiconductor structure includes an isolation field-effect transistor device interposed between the other field-effect transistor devices. The isolation field-effect transistor device is kept in the off-state to serve as an electrical isolation feature between the field-effect transistor devices. Compared with the conventional shallow trench isolation (STI) features, the isolation field-effect transistor device has a reduced area. Further, the semiconductor structure includes a back-side interconnect structure formed directly on the insulator layer opposite the front-side interconnect structure. The back-side interconnect structure provides an additional area for the routings for the isolation field-effect transistor device and the power circuits for other field-effect transistor devices disposed therein. Therefore, the area of the resulting semiconductor structure can be further reduced.

Figure 6B:
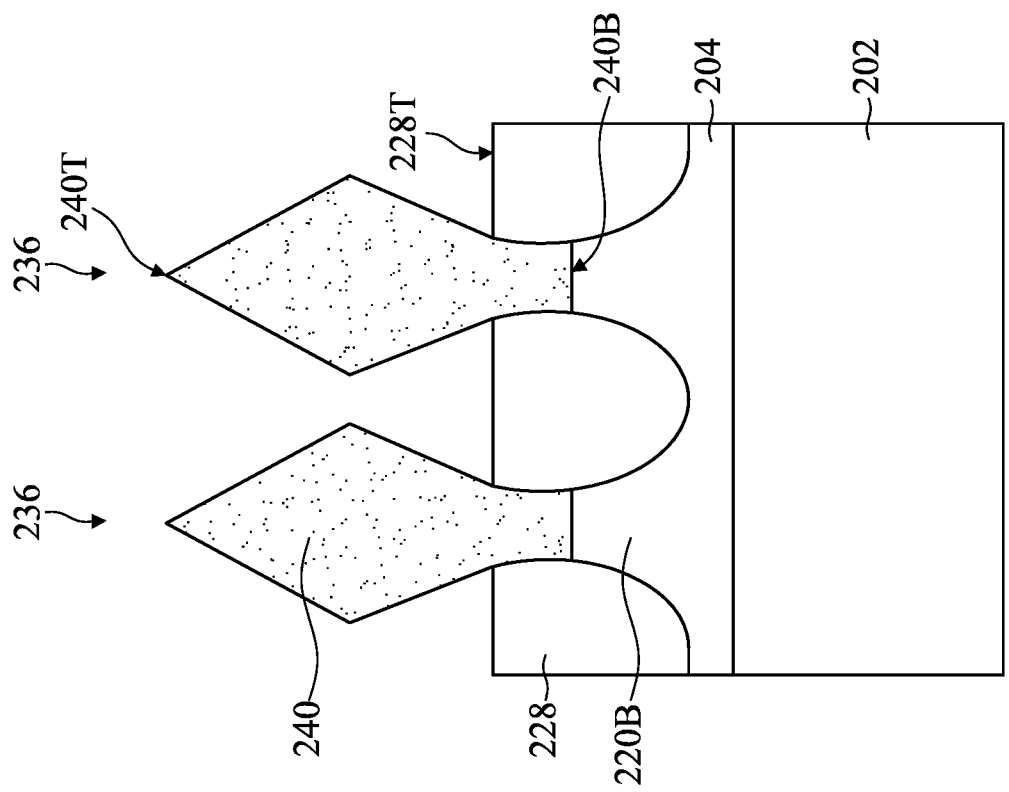
FIG. 6B illustrates a cross-sectional view of an intermediate stage of forming the semiconductor structure shown along line B-B' in FIG. 5 in accordance with some embodiments.
Figure 6A:
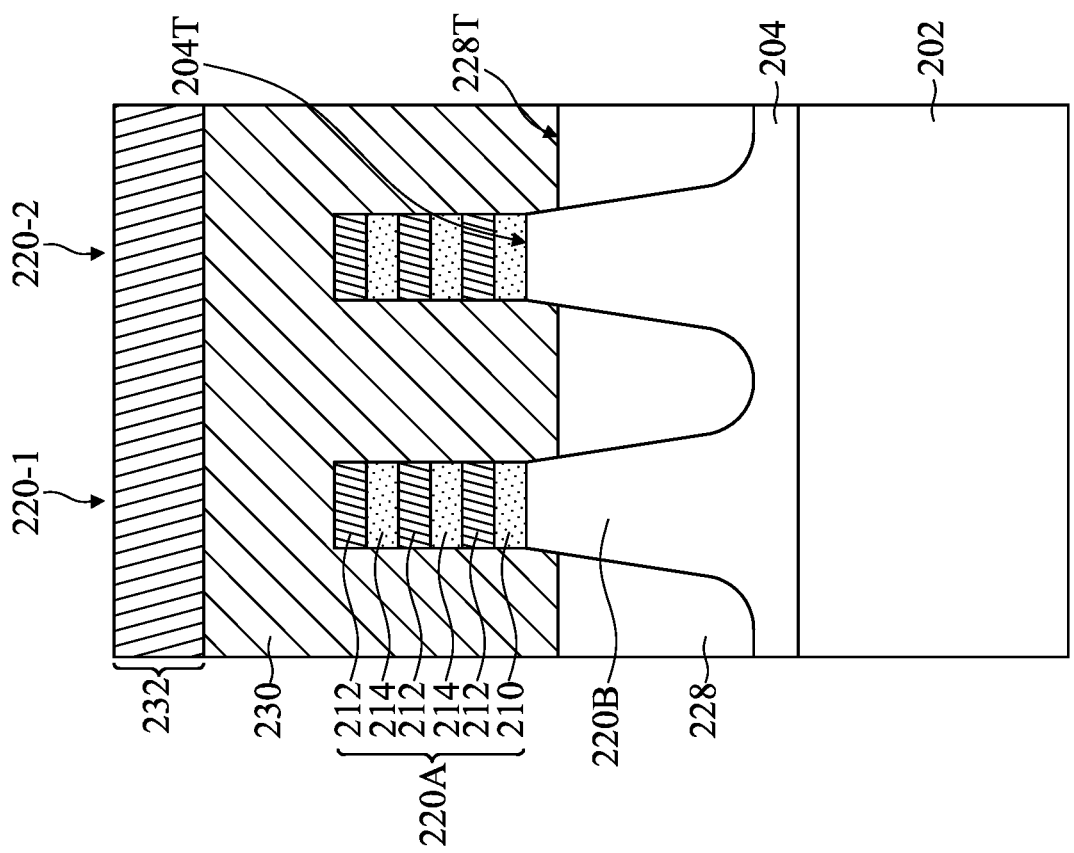
FIG. 6A illustrates a cross-sectional view of an intermediate stage of forming the semiconductor structure shown along line A-A' in FIG. 5 in accordance with some embodiments.
Figure 6C:
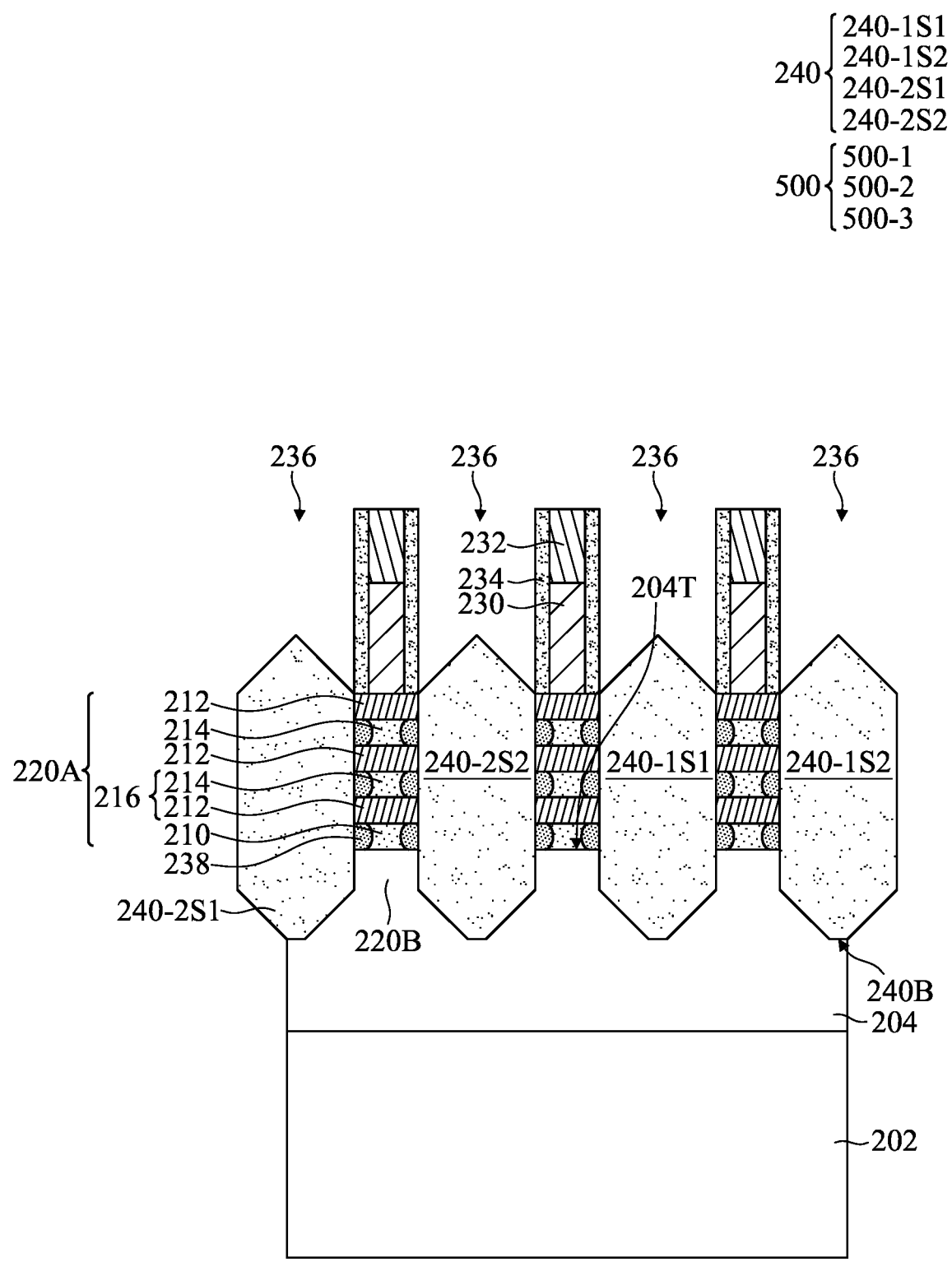
FIG. 6C illustrates a cross-sectional view of an intermediate stage of forming the semiconductor structure shown along line C-C' in FIG. 5 in accordance with some embodiments.
Figure 7C:
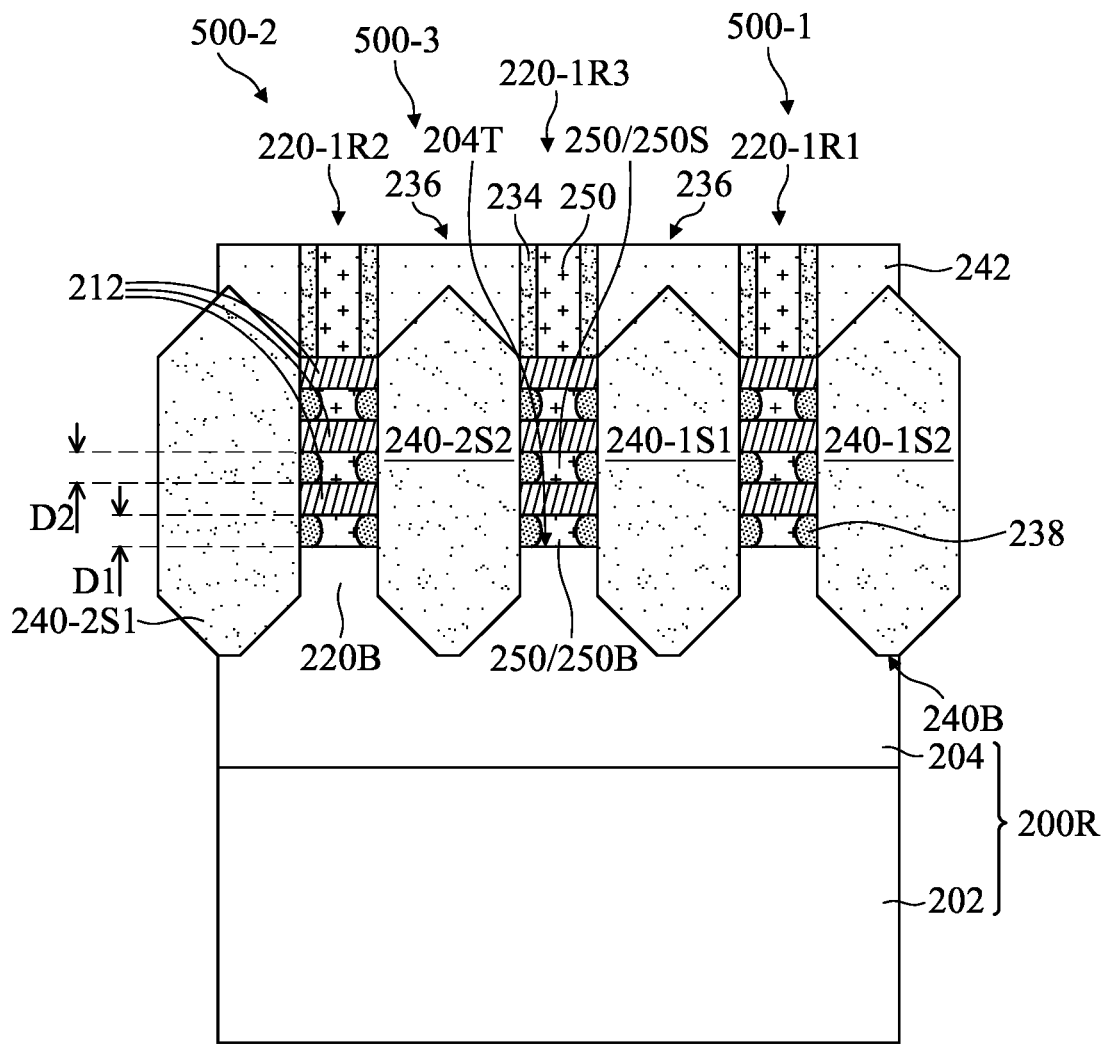
FIG. 7C illustrates a cross-sectional view of an intermediate stage of forming the semiconductor structure shown along line C-C' in FIG. 5 in accordance with some embodiments.

FIGS. 1-5 illustrate perspectives view of intermediate stages of forming a semiconductor structure 550 in accordance with some embodiments of the disclosure. FIGS. 1A, 2A, 5A, 4A and 5A illustrate cross-sectional views of intermediate stages of forming the semiconductor structure 550 shown along line A-A' in FIGS. 1-5 in accordance with some embodiments. FIGS. 6A and 7A illustrate cross-sectional views of subsequent intermediate stages of forming the semiconductor structure 550 in a channel region shown along line A-A' in FIG. 5 in accordance with some embodiments. FIGS. 6B and 7B illustrate cross-sectional views of subsequent intermediate stages of forming the semiconductor structure 550 of a source/drain region shown along line B-B' in FIG. 5 in accordance with some embodiments. FIGS. 6C and 7C illustrate cross-sectional views of subsequent intermediate stages of forming the semiconductor structure 550 along a fin structure 220-1 shown along line C-C' in FIG. 5 in accordance with some embodiments. FIGS. 8-12 illustrate cross-sectional views of subsequent intermediate stages of forming the semiconductor structure 550 shown along line C-C' in FIG. 5 in accordance with some embodiments. In addition, the present disclosure may repeat reference numerals and/or letters in the various examples.

Figure 1:
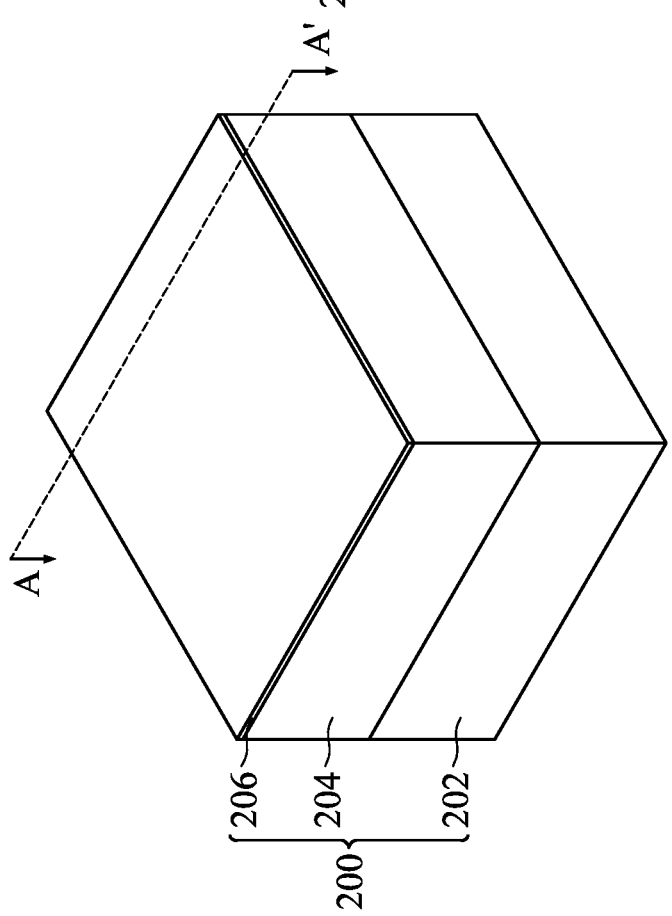
FIG. 1 illustrates a perspective view of an intermediate stage of forming a semiconductor structure in accordance with some embodiments of the disclosure.

As shown in FIGS. 1 and 1A, a semiconductor-on-insulator (SOI) substrate 200 is provided. The SOI substrate 200 comprises a bottom substrate layer 202, a middle insulator layer 204 and a top semiconductor layer 206. The middle insulator layer 204 formed entirely covering a top surface 202T of the bottom substrate layer 202 may comprise a buried oxide (BOX) layer or a silicon oxide layer. The top semiconductor layer 206 formed entirely covering a top surface 204T of the middle insulator layer 204 may contain first semiconductor atoms. For example, the top semiconductor layer 206 comprises silicon (Si) or silicon germanium (SiGe), and the first semiconductor atoms are silicon (Si). For example, the top semiconductor layer 206 only contains the first semiconductor atoms (e.g. Si). In some embodiments, the top semiconductor layer 206 is thinner than the bottom substrate layer 202 and the middle insulator layer 204. For example, a thickness of the top semiconductor layer 206 may be from about 8 nm to about 12 nm. In some embodiments, the bottom substrate layer 202 and the top semiconductor layer 206 comprise the same composition.

Figures 2, 2A:
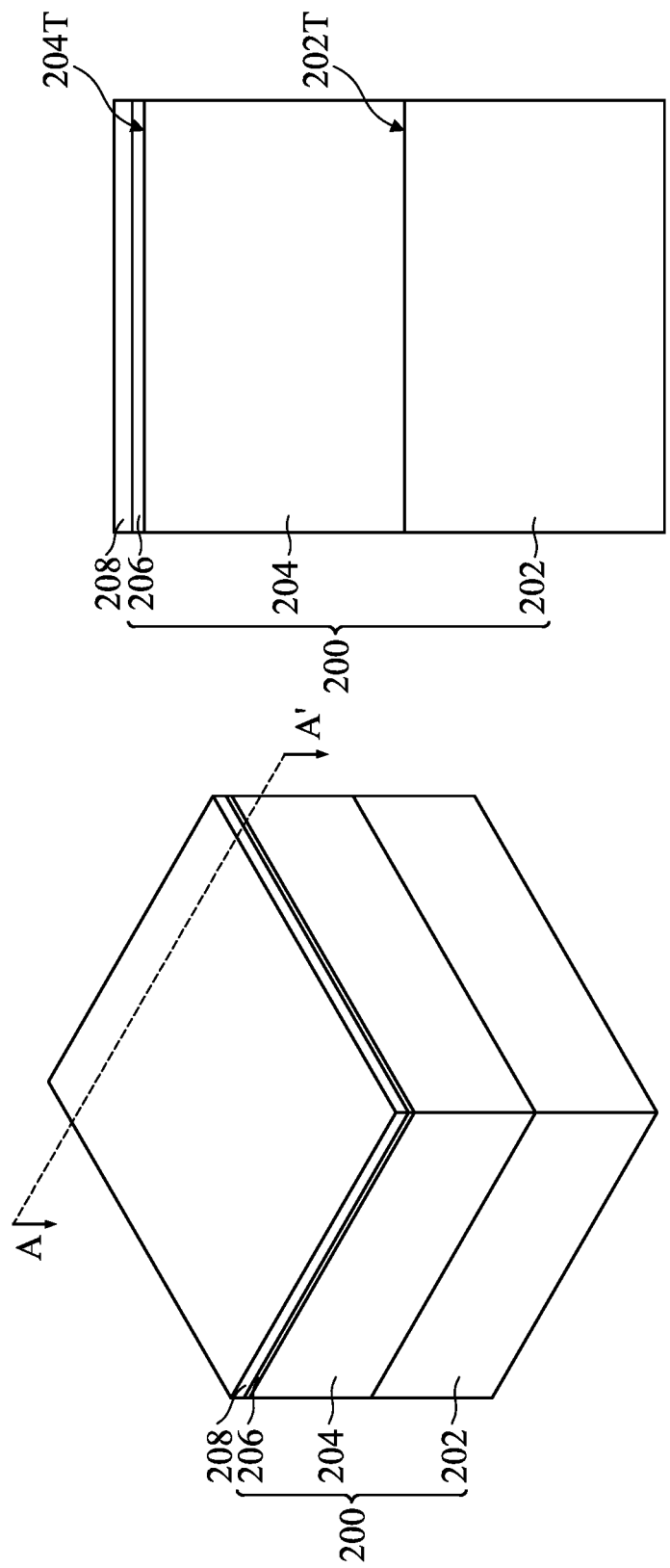
FIG. 2 illustrates a perspective view of an intermediate stage of forming a semiconductor structure in accordance with some embodiments of the disclosure.
FIG. 2A illustrates a cross-sectional view of an intermediate stage of forming the semiconductor structure shown along line A-A' in FIG. 3 in accordance with some embodiments.

As shown in FIGS. 2 and 2A, next, a semiconductor capping layer 208 is epitaxially grown on the top semiconductor layer 206. In some embodiments, the semiconductor capping layer 208 contains the first semiconductor atoms and second semiconductor atoms different from the first semiconductor atoms. For example, the semiconductor capping layer 208 comprises a silicon germanium (SiGe) layer, the first semiconductor atoms are silicon (Si) and the second semiconductor atoms are germanium (Ge). For example, the semiconductor capping layer 208 only contains the first semiconductor atoms (e.g. Si) and the second semiconductor atoms (e.g. Ge). In some embodiments, a composition of the semiconductor capping layer 208 is the same as that of subsequently formed second sacrificial layers 214. In some embodiments, a concentration (atomic percent) of the second semiconductor atoms of the semiconductor capping layer 208 is greater than that of subsequently formed second sacrificial layers 214. For example, when the semiconductor capping layer 208 is a silicon germanium (SiGe) layer, germanium (Ge) concentration (atomic percent) of the semiconductor capping layer 208 may be about 25-55%, such as 50%. In some embodiments, a thickness of the semiconductor capping layer 208 is the same or thicker that of the top semiconductor layer 206. For example, the thickness of the semiconductor capping layer 208 is from about 8 nm to about 20 nm. In some embodiments, the germanium-containing layer 208 is epitaxially grown by a molecular beam epitaxy (MBE) process, a metalorganic chemical vapor deposition (MOCVD) process, and/or other suitable epitaxial growth processes.

Figure 3A:
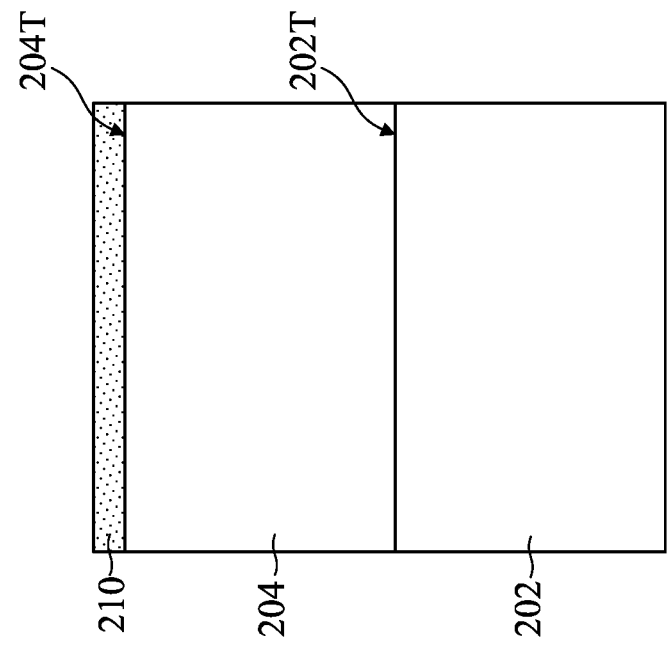
FIG. 3A illustrates a cross-sectional view of an intermediate stage of forming the semiconductor structure shown along line A-A' in FIG. 3 in accordance with some embodiments.
Figure 3:
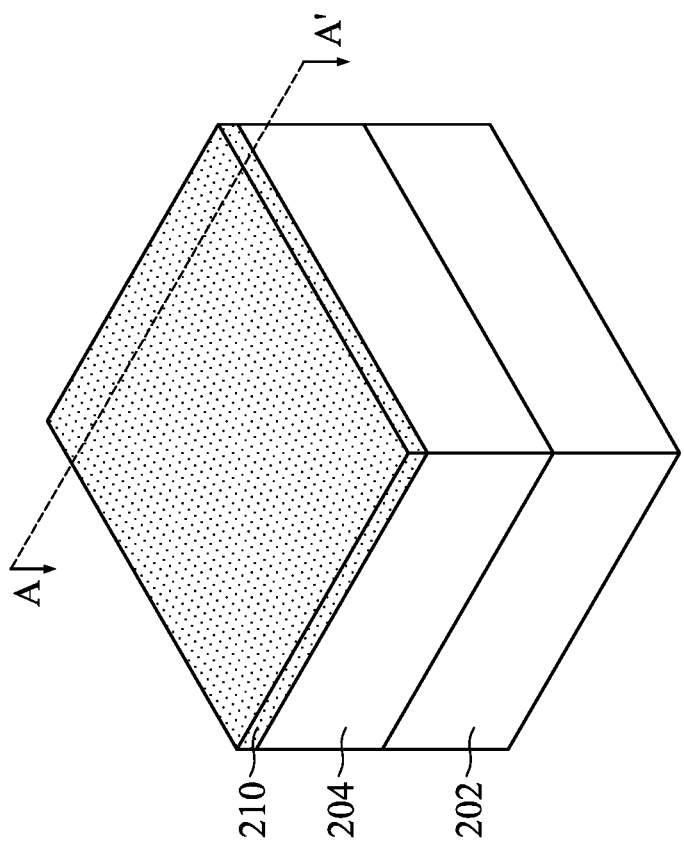
FIG. 3 illustrates a perspective view of an intermediate stage of forming a semiconductor structure in accordance with some embodiments of the disclosure.

As shown in FIGS. 3 and 3A, next, a thermal process is performed to drive the second semiconductor atoms (e.g. Ge atoms) of the semiconductor capping layer 208 (FIGS. 2 and 2A) into the top semiconductor layer 206 (FIGS. 2 and 2A). In addition, the semiconductor capping layer 208 and the top semiconductor layer 206 may have a uniform concentration of second semiconductor atoms (e.g. Ge atoms). After performing the thermal process, the semiconductor capping layer 208 and the top semiconductor layer 206 collectively form a first sacrificial layer 210. The first sacrificial layer 210 contains the first semiconductor atoms and second semiconductor atoms different from the first semiconductor atoms. For example, the first sacrificial layer 210 comprises a silicon germanium (SiGe) layer, the first semiconductor atoms are silicon (Si) and the second semiconductor atoms are germanium (Ge). In some embodiments, a concentration (e.g. Ge concentration) (atomic percent) of the second semiconductor atoms of the semiconductor capping layer 208 (FIGS. 2 and 2A) is greater than that of the first sacrificial layer 210. For example, when the first sacrificial layer 210 is a silicon germanium (SiGe) layer, germanium (Ge) concentration (atomic percent) of the first sacrificial layer 210 is about 20-30%, such as 25%.

In some other embodiments, when the top semiconductor layer 206 of the SOI substrate 200 and the subsequently formed second sacrificial layers 214 both contain the first semiconductor atoms and second semiconductor atoms, such as a silicon germanium (SiGe) layer. The top semiconductor layer 206 may serve as the first sacrificial layer, and the processes used to form the first sacrificial layer 210 can be omitted.

Figures 4, 4A:
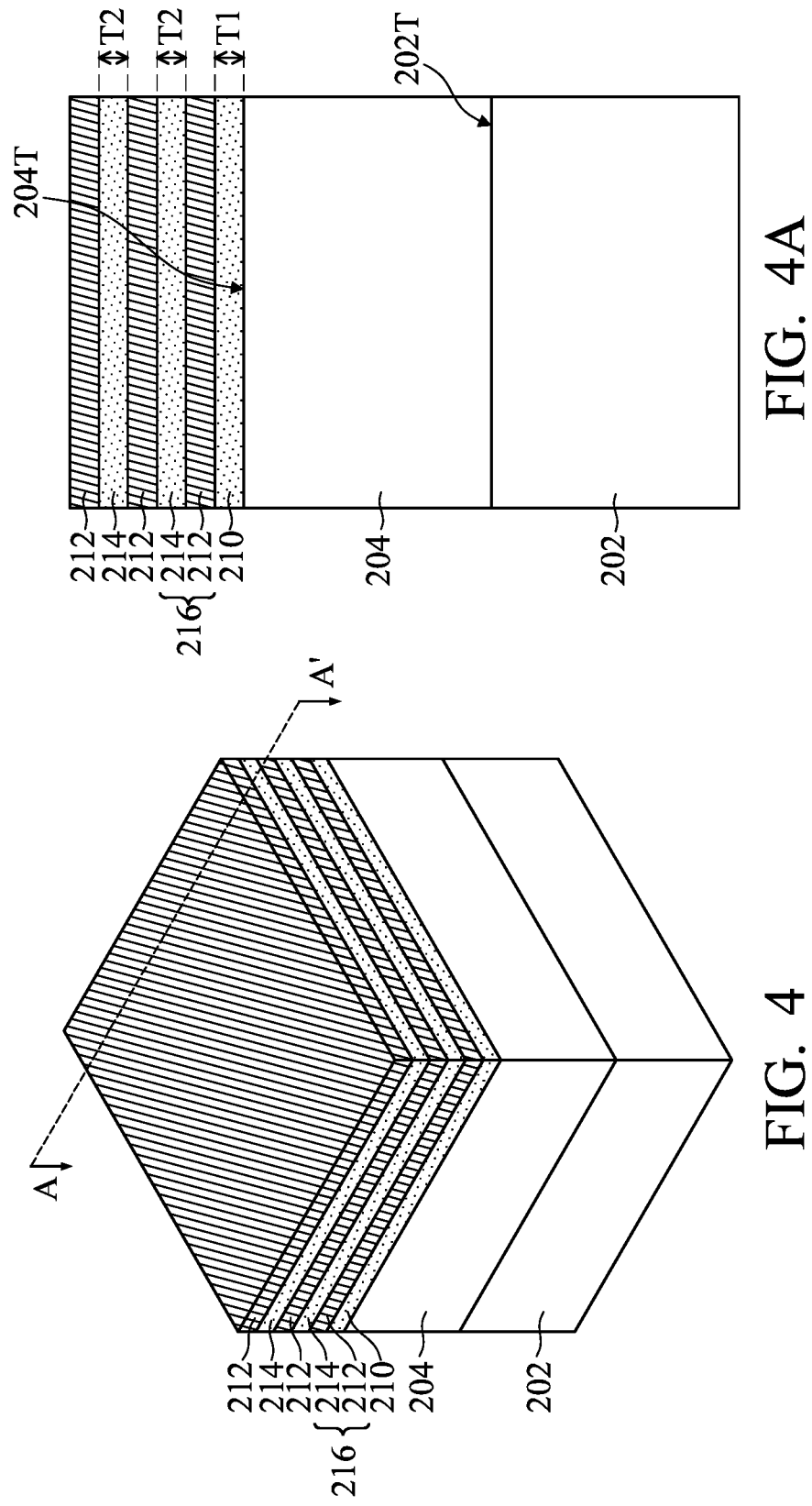
FIG. 4 illustrates a perspective view of an intermediate stage of forming a semiconductor structure in accordance with some embodiments of the disclosure.
FIG. 4A illustrates a cross-sectional view of an intermediate stage of forming the semiconductor structure shown along line A-A' in FIG. 4 in accordance with some embodiments.

As shown in FIGS. 4 and 4A, next, a stack 216 of alternating channel layers 212 and second sacrificial layers 214 is epitaxially grown on the first sacrificial layer 210. The channel layers 212 are interposed by the first sacrificial layer 210 and the second sacrificial layers 214. The first sacrificial layer 210 and the second sacrificial layers 214 define spacing between adjacent channel layers 212 and would be subsequently removed. In some embodiments, the first sacrificial layer 210 and the second sacrificial layers 214 may be formed of the same semiconductor materials and have the same thickness. The first sacrificial layer 210 and the second sacrificial layers 214 may both contain the first semiconductor atoms and the second semiconductor atoms. The first sacrificial layer 210 may have a first composition, and the second sacrificial layers 214 may have a second composition. The second composition is the same as the first composition. For example, the first sacrificial layer 210 and the second sacrificial layers 214 may be silicon germanium (SiGe) layers having the same Ge concentration. In some embodiments, the first sacrificial layer 210 has a first thickness T1, and the second sacrificial layers 214 have a second thickness T2, which is the same as the first thickness T1. For example, the first thickness T1 and the second thickness T2 are from about 16 nm to about 32 nm. The first thickness T1 and the second thickness T2 may have desired ranges according to the device performance.

As shown in FIGS. 4 and 4A, a bottommost layer of the channel layer 212 is in contact with the first sacrificial layer 210 after epitaxially growing the stack 216 of alternating channel layers 212 and second sacrificial layers 214. In some embodiments, the channel layers 212 may contain the first semiconductor atoms (e.g. Si) but not the second semiconductor atoms (e.g. Ge). The channel layers 212 have a third composition. The third composition is different from the first composition of the first sacrificial layer 210 and the second composition of the second sacrificial layers 214. For example, when the first sacrificial layer 210 and the second sacrificial layers 214 are silicon germanium (SiGe) layers, the channel layers 212 are silicon (Si) layers. In addition, the first composition and the third composition (or the second composition and the third composition) may have different oxidation rates and/or etch selectivity. In some embodiments, the stack 216 of alternating channel layers 212 and second sacrificial layers 214 comprises a first number of channel layers 212 and a second number of second sacrificial layers 214, and the first number is different from the second number. For example, the first number is greater than the second number. For example, a difference between the first number and the second number is 1. In some embodiments, the total number of first sacrificial layers 210 and second sacrificial layers 214 is the same as the number of channel layers 212. It should be noted that although three channel layers 212 and two second sacrificial layers 214 are formed in the figures, the stack 216 of alternating channel layers 212 and second sacrificial layers 214 may include more or fewer channel layers 212 and second sacrificial layers 214. For example, the stack 216 of alternating channel layers 212 and second sacrificial layers 214 may include from two to ten channel layers 212 and from one to nine second sacrificial layers 214 individually, depending on the desired number of channel layers for forming transistors. In some embodiments, the channel layers 212 have a uniform thickness. In addition, the thickness of the channel layers 212 may have a desired range according to the device performance. For example, the thickness of the channel layers 212 may be similar to the first thickness T1 of the first sacrificial layer 210 and the second thickness T2 of the second sacrificial layers 214. In some embodiments, the channel layers 212 and the second sacrificial layers 214 are epitaxially grown using a molecular beam epitaxy (MBE) process, a metalorganic chemical vapor deposition (MOCVD) process, or another suitable epitaxial growth process.

As shown in FIGS. 5 and 5A-5C, next, the middle insulator layer 204, the first sacrificial layer 210 and the stack 216 of alternating channel layers 212 and second sacrificial layers 214 are patterned to form fin structures 220-1 and 220-2 protruding from the SOI substrate 200 and a trench 224 between the fin structures 220-1 and 220-2. The fin structures 220-1 and 220-2 may be used to form GAA devices having different conductivity types or the same conductivity type. Each of the fin structures 220-1 and 220-2 comprises an upper portion 220A and a base portion 220B. The upper portion 220A is formed from patterning the first sacrificial layer 210 and the stack 216 of alternating channel layers 212 and second sacrificial layers 214. The base portion 220B is formed by patterning the middle insulator layer 204 (e.g. the top portion of the top portion) of the SOI substrate 200. That is to say, the base portion 220B is formed from the middle insulator layer 204.

Figure 5A:
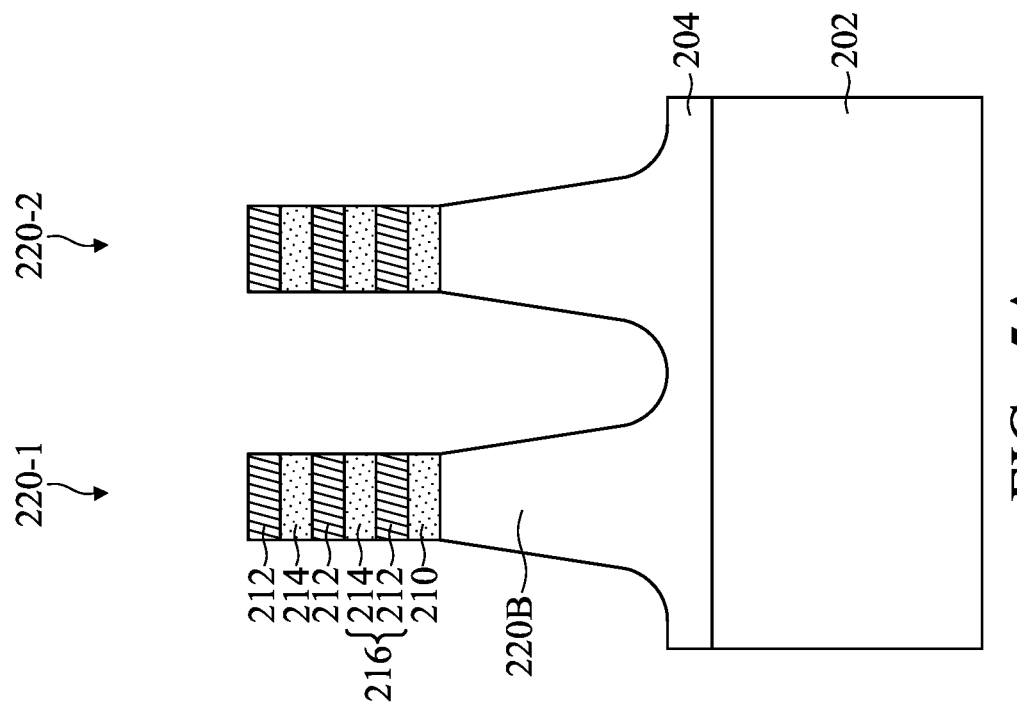
FIG. 5A illustrates a cross-sectional view of an intermediate stage of forming the semiconductor structure shown along line A-A' in FIG. 5 in accordance with some embodiments.
Figure 5:
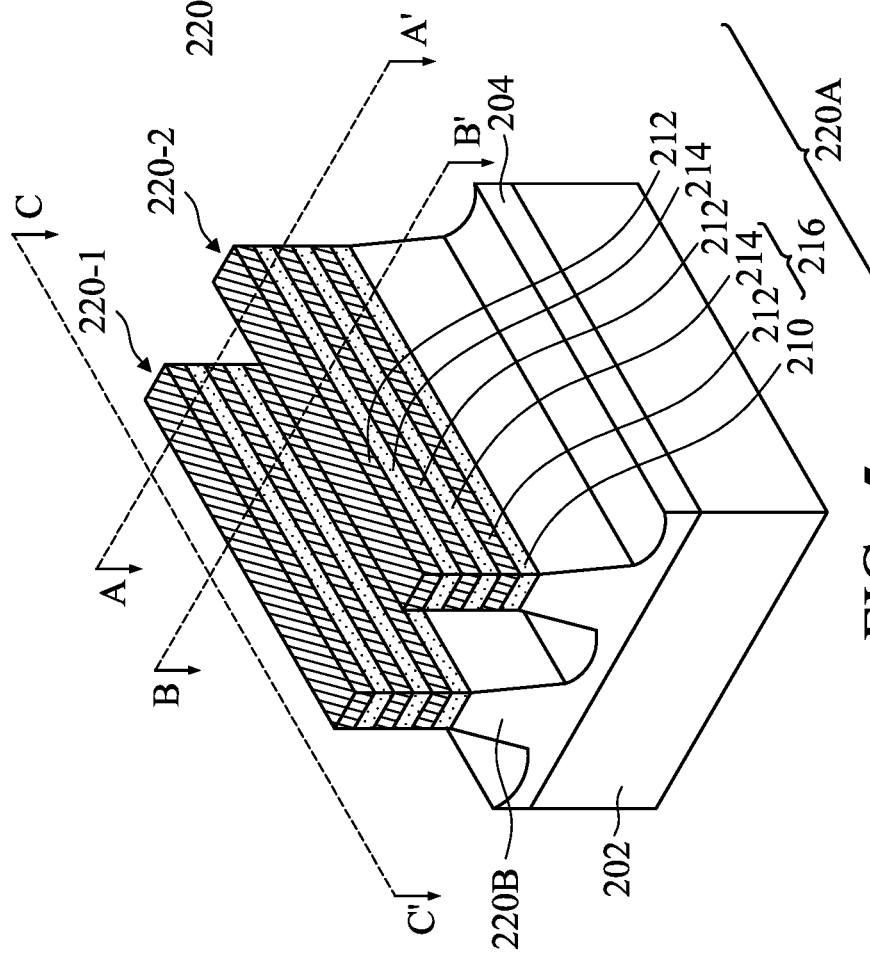
FIG. 5 illustrates a perspective view of an intermediate stage of forming a semiconductor structure in accordance with some embodiments of the disclosure.
Figure 5C:
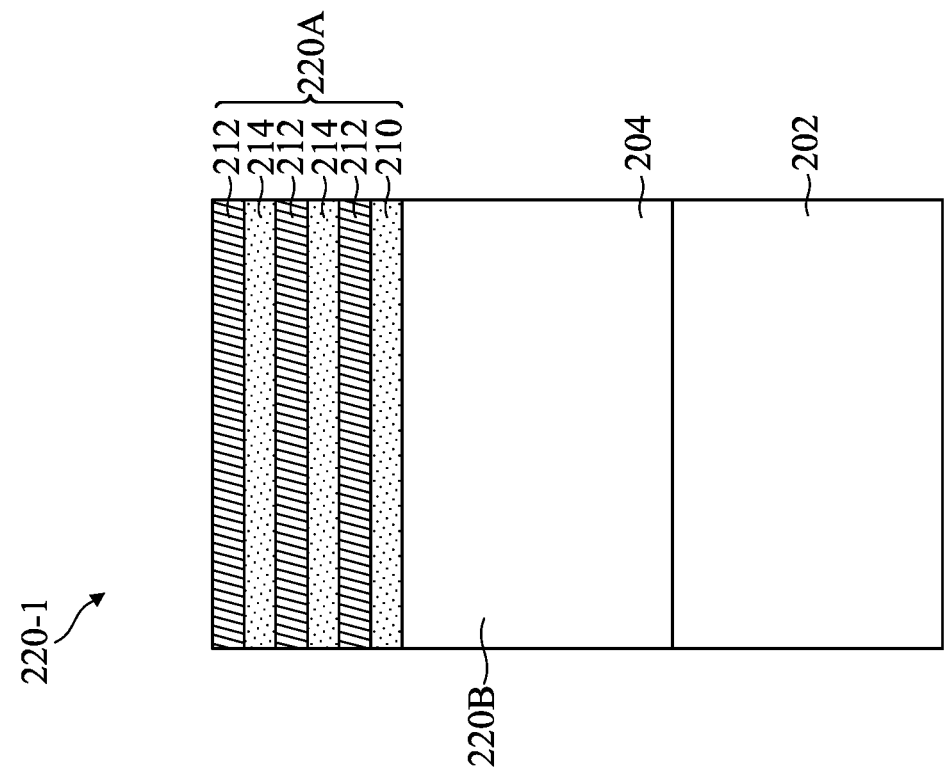
FIG. 5C illustrates a cross-sectional view of an intermediate stage of forming the semiconductor structure shown along line C-C' in FIG. 5 in accordance with some embodiments.
Figure 5B:
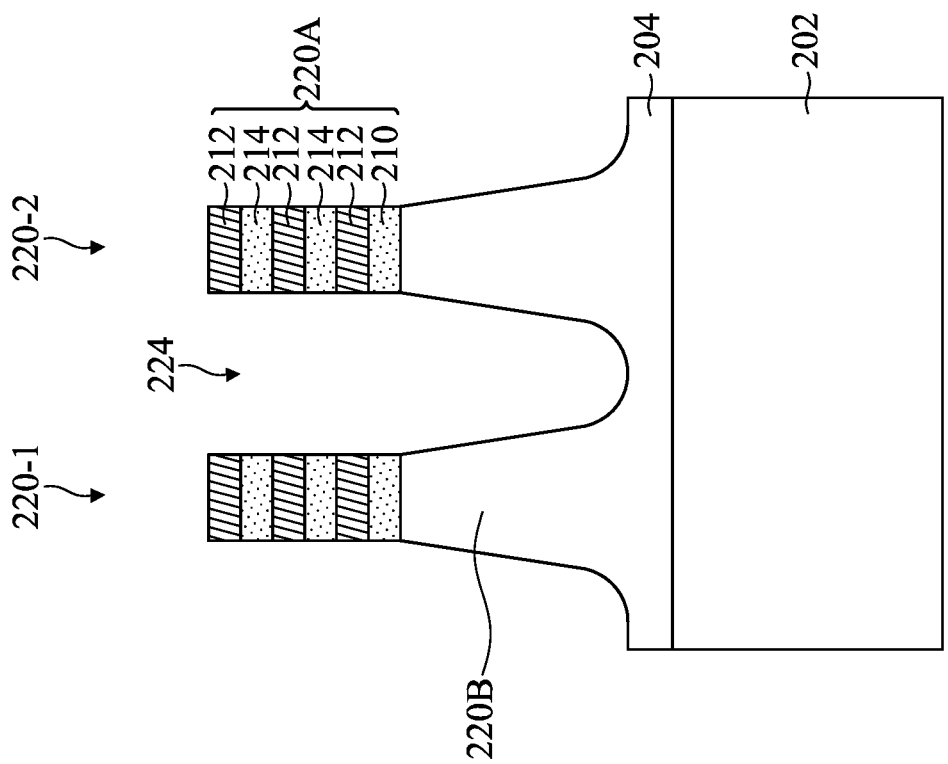
FIG. 5B illustrates a cross-sectional view of an intermediate stage of forming the semiconductor structure shown along line B-B' in FIG. 5 in accordance with some embodiments.

As shown in FIGS. 5A and 5B, the trench 224 is formed through the entire stack 216 of alternating channel layers 212 and second sacrificial layers 214, the entire first sacrificial layer 210, and a portion of the middle insulator layer 204. Therefore, the middle insulator layer 204 is exposed from the bottom of the trench 224. In some embodiments, the fin structures 220-1 and 220-2 are formed by double-patterning or multi-patterning processes including several cycles of photolithography and etching processes. The etching process comprise a dry etch (e.g., reactive ion etching), a wet etch, and/or other suitable process.

As shown in FIGS. 6A-6C after forming the fin structures 220-1 and 220-2, isolation features 228 are formed on sidewalls of the base portion 220B of each of the fin structures 220-1 and 220-2. The isolation features 228 are formed around the base portion of each of the fin structures 220-1 and 220-2. In addition, top surfaces 228T of the isolation features 228 are lower than a top portion of the base portion 220B in the channel region of each of the fin structures 220-1 and 220-2. In some embodiments, the isolation feature 228 comprises silicon oxide, silicon nitride, silicon oxynitride (SiON), another suitable insulating material, or a combination thereof. In some embodiments, the isolation feature 228 is formed by performing a depositing process of an insulating material (not shown), a planarization process and a recessing process. The depositing process may be performed to form the insulating material (not shown) filling the trench 224. The depositing process may comprise thermal growth, spin-on coating, chemical vapor deposition (CVD), high density plasma CVD (HDP-CVD), physical vapor deposition (PVD), atomic layer deposition (ALD), or any other applicable deposition processes. The planarization process may be performed so that a top surface of the insulating material (not shown) is level with a top surface of each of the fin structures 220-1 and 220-2. The planarization process may comprise chemical mechanical polishing (CMP) or any other applicable planarization processes. In addition, the recessing process may be performed to recess the insulating material to form the isolation features 228. The recessing process may comprise reactive ion etching (RIE), dry etching, wet etching, or any other applicable etching processes.

As shown in FIGS. 6A-6C, next, dummy gate structures 230 are formed on the channel regions of the fin structures 220-1 and 220-2 and extending over the isolation features 228. The dummy gate structure 230 may be used to define the source/drain regions and the channel regions of the resulting field-effect devices (e.g. field-effect devices 500-1, 500-2 and an isolation field-effect device 500-3) of the semiconductor structure 550. In some embodiments, each of the dummy gate structures 230 comprises a dummy gate dielectric layer (not shown) and a dummy gate electrode layer (not shown) disposed over the dummy gate dielectric layer. In some embodiments, the dummy gate dielectric layer may comprise silicon oxide, silicon nitride, silicon oxynitride (SiON) or any other applicable dielectric materials, and the dummy gate electrode layer may comprise polycrystalline-silicon (poly-Si), poly-crystalline silicon-germanium (poly-SiGe) or any other applicable conductive materials. In some embodiments, each of the dummy gate structures 230 is formed by a deposition process and a subsequent patterning process. The patterning process is performed using hard mask structures 232, which are formed on the dummy gate structures 230, as masks covering the channel regions of the fin structures 220-1 and 220-2. In some embodiments, each of the hard mask structures 232 comprises multiple layers including a silicon nitride layer and a silicon oxide on the silicon nitride layer.

As shown in FIGS. 6A-6C, next, gate spacers 234 are formed on sidewalls of each of the dummy gate structures 230. In some embodiments, the gate spacers 234 comprise a dielectric material such as silicon oxide ($SiO_2$), silicon nitride (SiN), silicon carbide (SiC), silicon oxynitride (SiON), silicon carbon nitride (SiCN), silicon oxide carbonitride (SiOCN), or any other applicable dielectric materials. In some embodiments, the gate spacers 234 are conformally formed by a deposition process and a subsequent etching back process. The deposition process may be performed to form the dielectric material over a top surface and the sidewalls of each of the dummy gate structures 230. The deposition process may comprise chemical vapor deposition (CVD), flowable chemical vapor deposition, subatmospheric chemical vapor deposition (SACVD), physical vapor deposition (PVD), atomic layer deposition (ALD), or any other applicable deposition processes. The etching back process may be performed to remove a portion the dielectric material over the top surface of each of the dummy gate structures 230, thereby exposing the hard mask structures 232 and form the gate spacers 234. The etching back process may comprise wet etching, dry etching or a combination thereof.

As shown in FIGS. 6B-6C, next, portions of the fin structures 220-1 and 220-2 are removed until the middle insulator layer 204 is exposed to form source/drain recesses 236 in the source/drain regions of each of the fin structures 220-1 and 220-2. The upper portion 220A and a top portion of the base portion 220B in the source/drain regions of each of the fin structures 220-1 and 220-2 are anisotropically etched by an anisotropically etching process using the dummy gate structures 230 and the gate spacers 234 as etch masks. The source/drain recesses 236 may be formed extending into the base portion 220B below the top surface 228T of the isolation feature 228. In some other embodiments, the anisotropically etching process only removes the upper portion 220A and stops on the base portion 220B in the source/drain regions of each of the fin structures 220-1 and 220-2. Therefore, the source/drain recesses 236 may not be formed extending below the top surface 228T of the isolation feature 228. The middle insulator layer 204 in the source/drain regions is exposed by the source/drain recesses 236. In some embodiments, the anisotropically etching process comprises dry etching.

As shown in FIG. 6C, next, the first sacrificial layer 210 and the second sacrificial layers 214 exposed by the source/drain recesses 236 are laterally and partially removed to form recesses (not shown) by an etching process. During the etching process, the first sacrificial layer 210 and the second sacrificial layers 214 may have a greater etching rate than the channel layers 212. In some embodiments, the etching process may be a wet etching process, a dry etching process, or a combination thereof.

As shown in FIG. 6C, after forming the source/drain recesses 236 and the recesses (not shown), inner spacers 238 are formed on lateral ends of the first sacrificial layer 210 and the second sacrificial layers 212. The inner spacers 238 formed on lateral ends of the first sacrificial layer 210 are in contact with the middle insulator layer 204. The inner spacers 238 are formed between and in contact with the channel layers 210 vertically adjacent to each other. In addition, the inner spacers 238 in contact with the middle insulator layer 204 of the SOI substrate 200 are in contact with the bottommost layer of the channel layers 212. In some embodiments, the inner spacers 238 comprises dielectric materials such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the inner spacers 238 are formed by a deposition process of a dielectric material (not shown) and a subsequent etching back process. The deposition process may be performed to fill the recesses with the dielectric material. In some embodiments, the deposition process comprises atomic layer deposition (ALD) or another applicable deposition process. The etching back process may be performed to partially remove the insulating layer from outside of the recesses, thereby forming the inner spacers 238.

As shown in FIGS. 6B-6C, next, epitaxial source/drain structures 240 comprising epitaxial source/drain structures 240-1S1, 240-1S2, 240-2S1 and 240-2S2 are formed in the source/drain recesses 236. The epitaxial source/drain structures 240 are connected to the channel layers 212. Bottom portions 240B of the epitaxial source/drain structures 240 are in contact with the middle insulator layer 204 of the SOI substrate 200. In addition, the epitaxial source/drain structures 240 are isolated from the bottom substrate layer 202 of the SOI substrate 200 by the middle insulator layer 204. The topmost layer of the channel layers 212 and the top surface 228T of the isolation features 228 are positioned vertically between a top portion 240T and the bottom portion 240B of the corresponding epitaxial source/drain structure 240. Because the top semiconductor layer 206 (FIGS. 1 and 1A) of the SOI substrate 200 is transformed into the first sacrificial layer 210 and removed in the source/drain regions of each of the fin structures 220-1 and 220-2 in the previously described processes, and the lateral ends of the first sacrificial layers 210 in the channel region are covered by the inner spacers 238, the subsequently formed epitaxial source/drain structures 240 would not be in contact with any semiconductor layer above the middle insulator layer 204 of the SOI substrate 200 except for the corresponding channel layers 212. The substrate leakage of the resulting semiconductor structure 550 can be eliminated.

In some embodiments, the epitaxial source/drain structures 240 comprise epitaxial semiconductor materials in-situ or ex-situ doped with an n-type dopant or a p-type dopant. For example, the epitaxial source/drain structures 240 may comprise silicon (Si) doped with phosphorous (P) for forming epitaxial source/drain structures for an n-type semiconductor device (e.g. an n-type GAA transistor). For example, the epitaxial source/drain structures 240 may comprise silicon-germanium (SiGe) doped with boron for forming epitaxial source/drain structures for a p-type device (e.g. a p-type GAA transistor). In some embodiments, the epitaxial source/drain structures 240 are epitaxially grown only from the channel layers 212 by an epitaxial growth process includes molecular beam epitaxy (MBE), metal organic chemical vapor deposition (MOCVD), vapor phase epitaxy (VPE), or other applicable epitaxial growth processes.

As shown in FIGS. 7A-7C, next, a contact etch stop layer (CESL) (not shown) an interlayer dielectric (ILD) layer 242 of a front-side interconnect structure 260 (shown in FIG. 8) are formed on the epitaxial source/drain structures 240 and the isolation features 228. In some embodiments, the CESL layer comprises silicon nitride, silicon nitride, silicon oxynitride, other applicable dielectric materials, or a combination thereof. In some embodiments, the CESL layer is formed by chemical vapor deposition (CVD), physical vapor deposition, (PVD), atomic layer deposition (ALD) or other applicable deposition processes. In some embodiments, the ILD layer 242 comprises borophosphosilicate glass (BPSG), fused silica glass (FSG), phosphosilicate glass (PSG), boron doped silicon glass (BSG), tetraethylorthosilicate (TEOS) oxide, and/or other applicable dielectric materials In some embodiments, the ILD layer 242 is formed by chemical vapor deposition (CVD), physical vapor deposition, (PVD), atomic layer deposition (ALD) or other applicable deposition processes. After forming the CESL layer and the ILD layer 242, a planarization process may be performed until the top surfaces of the dummy gate structures 230 are exposed. The planarization process may comprise chemical mechanical polishing (CMP), etching back or a combination thereof.

As shown in FIGS. 7A-7C, after forming epitaxial source/drain structures 240, the dummy gate structures 230, the first sacrificial layer 210 and the second sacrificial layers 214 are selectively removed to expose the channel layers 212 in the channel regions. In addition, trenches (not shown) between the gate spacers 234 are formed. In some embodiments, a first etch selectivity between the first sacrificial layer 210 and the channel layers 212 is the same as a second etch selectivity between the second sacrificial layer 214 and the channel layers 212 during the selective removal of the first sacrificial layer 210 and the second sacrificial layers 214. Therefore, the first sacrificial layer 210 and the second sacrificial layers 214 may be simultaneously removed from the channel layers 212. Further, the dummy gate structures 230, the first sacrificial layer 210 and the second sacrificial layers 214 are selectively removed without damaging the channel layers 212 and the gate spacers 234. After removing the first sacrificial layer 210, the top surface 204T of the middle insulator layer 204, which is away from the bottom substrate layer 202, may serve as a top surface of a resulting substrate 200R. In some embodiments, the dummy gate structure 230, the first sacrificial layer 210 and the second sacrificial layers 214 are selectively removed by a selective etching process may be a selective wet etching process, a selective dry etching process, or a combination thereof.

As shown in FIGS. 7A-7C, next, gate structures 250 are formed wrapping the channel layers 212, thereby forming the resulting fin structures 220-1R and 220-2R. In addition, the fin structures 220-1R comprise fin structures 220-1R1, 220-1R2 and 220-1R3. In addition, the gate structure 250 is formed filling the trench (not shown) between the gate spacers 234. In some embodiments, each of the fin structures 220-1R1, 220-1R2 and 220-1R3 comprises the channel layers 212 and the gate structure 250 that is wrapped around the channel layer 212. Because the first sacrificial layer 210 and the second sacrificial layers 214 may have the same thickness (the first thickness T1 of the first sacrificial layer 210 and the second thickness T2 of the second sacrificial layers 214 shown in FIG. 4A), a first distance D1 between the bottommost layer of the channel layers 212 and the top surface 204T of the middle insulator layer 204 may be the same as a second distance D2 between the bottommost layer of the channel layers 212 and the adjacent channel layer 212 opposite the middle insulator layer 204. In other words, a first portion (e.g. the bottom portion 250B of the gate structure 250) of the gate structure 250 between the bottommost layer of the channel layers 212 and the top surface 204T of the middle insulator layer 204 has a first thickness (which is the same as the first distance D1), a second portion 250S of the gate structure 250 between the bottommost layer of the channel layers 212 and the adjacent channel layer 212 opposite the middle insulator layer 204 has a second thickness (which is the same as the second distance D2). The second thickness is the same as the first thickness. In addition, the inner spacers 238 are disposed on lateral ends of the gate structure 250. The inner spacers 238 on the bottom portion 250B of the gate structure 250 are in contact with the middle insulator layer 204 of the substrate 200R. In some embodiments, each of the fin structures 220-1R1, 220-1R2 and 220-1R3 comprises the base portion 220B under the gate structure 250 and the channel layers 212. The base portion 220B is also connected to the gate structure 250. In some embodiments, the gate structure 250 may be isolated from the bottom substrate layer 202 of the substrate 200R by the middle insulator layer 204. Therefore, the substrate leakage of the resulting semiconductor structure 550 can be eliminated.

In some embodiments, the gate structure 250 comprises a gate dielectric layer (not shown) wrapping the channel layers 212 and a gate electrode layer (not shown) formed on the gate dielectric layer in the channel region. In some embodiments, the gate dielectric layer comprises silicon oxide, silicon nitride, or high-k dielectric material, other applicable dielectric material or combinations thereof. In some embodiments, the gate dielectric layer is formed by chemical vapor deposition (CVD), physical vapor deposition, (PVD), atomic layer deposition (ALD) or other applicable deposition processes. In some embodiments, the gate electrode layer comprises conductive materials. In some embodiments, the gate electrode layer is formed by chemical vapor deposition (CVD), physical vapor deposition, (PVD), atomic layer deposition (ALD) or other applicable deposition processes. After performing the aforementioned processes, field-effect transistor devices 500, which comprises field-effect transistor devices 500-1, 500-2 and an isolation field-effect transistor device 500-3, of the resulting semiconductor structure 550 are completely formed.

In some embodiments, the field-effect transistor devices 500-1, 500-2 and the solation field-effect transistor device 500-3 are disposed side-by-side. The isolation field-effect transistor device 500-3 is interposed between the field-effect transistor device 500-1 and the field-effect transistor device 500-2. The epitaxial source/drain structure 240-2S2 of the isolation field-effect transistor device 500-3 is also used as the epitaxial source/drain structure 240-2S2 of the adjacent field-effect transistor device 500-2. The epitaxial source/drain structure 240-1S1 of the isolation field-effect transistor device 500-3 is also used as the epitaxial source/drain structure 240-1S1 of the adjacent field-effect transistor device 500-1. In some embodiments, the isolation field-effect transistor device 500-2 is kept in the off-state to be used as an electrical and physical isolation feature between the field-effect transistor devices 500-1 and 500-2. Compared with the conventional semiconductor structures embedded in the substrate, such as shallow trench isolation (STI) features, the area of the isolation feature of the resulting semiconductor structure 550 can be further reduced.

In some embodiments, each of the field-effect transistor devices 500-1, 500-2 and the isolation field-effect transistor device 500-3 comprises the substrate 200R, the fin structures 220-1R (including the fin structures 220-1R1, 220-1R2 and 220-1R3) and 220-2R and the epitaxial source/drain structures 240. The substrate 200R formed from the SOI substrate 200 comprises the bottom substrate layer 202 and the middle insulator layer 204 on the bottom substrate layer 202. The fin structures 220-1R1, 220-1R2 and 220-1R3 (or the fin structure 220-2R) are formed over the substrate 200R. Each of the fin structures 220-1R1, 220-1R2 and 220-1R3 (or the fin structure 220-2R) comprises the channel layers 212 and the gate structure 250 that is wrapped around the channel layers 212. The epitaxial source/drain structures 240 are connected to the channel layers 212. A bottom portion 240B of each of the epitaxial source/drain structures 240 is in contact with the middle insulator layer 204 of the substrate 200R. Because the top semiconductor layer 206 (FIGS. 1 and 1A) of the SOI substrate 200 is transformed into the first sacrificial layer 210 formed of the first semiconductor atoms (e.g. Si) by driving the second semiconductor atoms (e.g. Ge) from the semiconductor capping formed thereon. The first sacrificial layer 210 and the second sacrificial layers 214 formed of the first semiconductor atoms (e.g. Si) and the second semiconductor atoms (e.g. Ge) are then removed before forming the gate structure 250. The epitaxial source/drain structures 240 would not be in contact with any semiconductor layer above the middle insulator layer 204 of the substrate 200R except for the channel layers 212. In addition, the gate structure 250 may be isolated from the bottom substrate layer 202 of the substrate 200R by the middle insulator layer 204. Therefore, the substrate leakage of the resulting semiconductor structure 550 can be eliminated without extra dopants implanted into bottoms of the gate structure and epitaxial source/drain structures.

Figure 8:
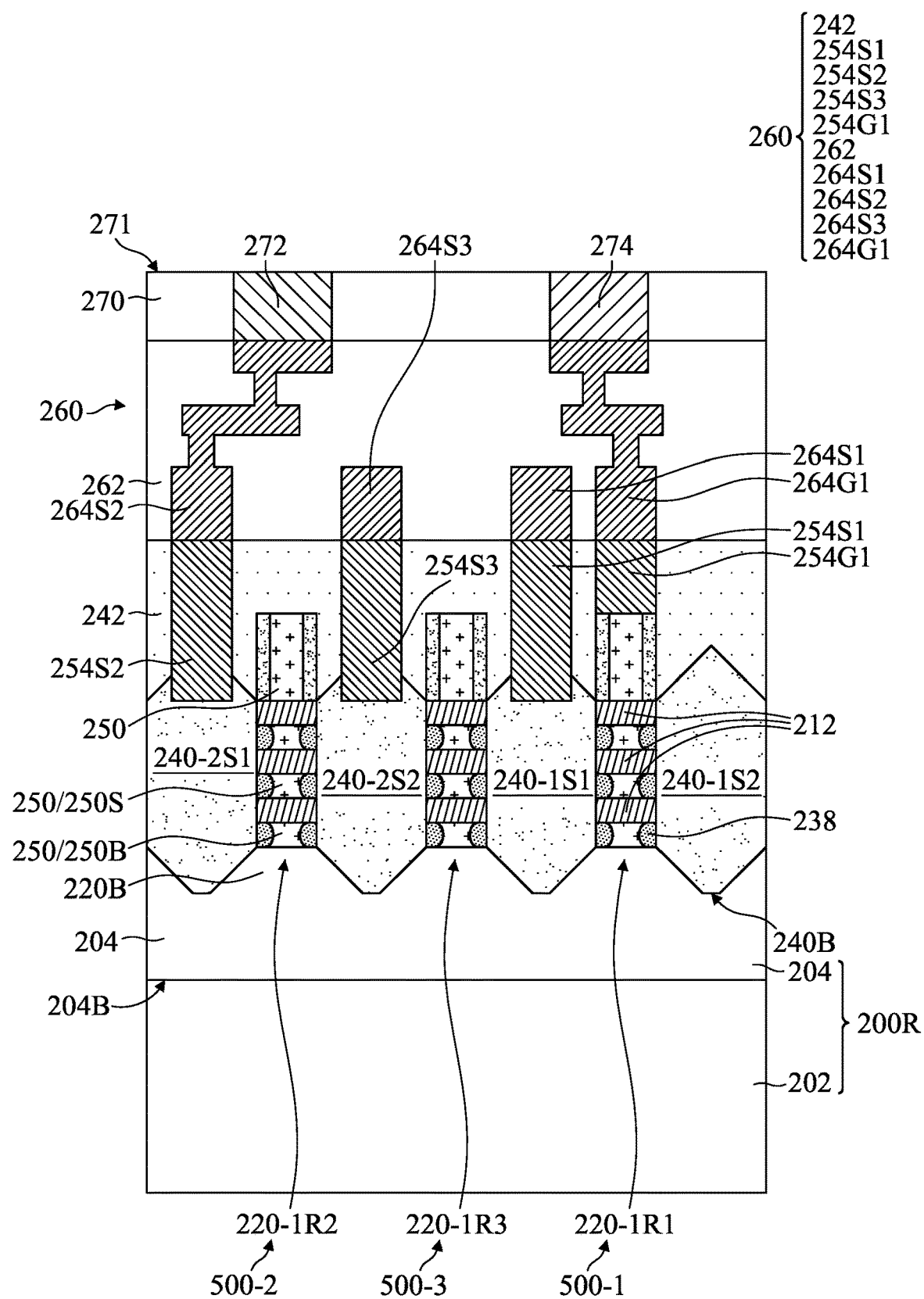
FIGS. 8-12 illustrate cross-sectional views of intermediate stages of forming the semiconductor structure shown along line C-C' in FIG. 5 in accordance with some embodiments.

As shown in FIG. 8, the interlayer dielectric (ILD) layer 242 is patterned to form openings (not shown) to expose the epitaxial source/drain structure 240-1S1 and the gate structure 250 of the field-effect transistor device 500-1 and the epitaxial source/drain structures 240-2S1 and 240-2S2 of the field-effect transistor device 500-2. Next, a deposition process and a subsequent planarization process are performed to form a front-side gate contact 254G1 and front-side source/drain contacts 254S1, 254S2 and 254S3 of the front-side interconnect structure 260. The front-side gate contact 254G1 and the front-side source/drain contacts 254S1, 254S2 and 254S3 of the front-side interconnect structure 260 are formed over the top surface 204T of the insulator layer 204 and passing through the interlayer dielectric (ILD) layer 242. In addition, the front-side gate contact 254G1 and the front-side source/drain contacts 254S1, 254S2 and 254S3 are formed on the field-effect transistor devices 500-1, 500-2 and the isolation field-effect transistor device 500-3 opposite the insulator layer 204. In some embodiments, the front-side gate contact 254G1 is electrically connected the gate structure 250 of the field-effect transistor device 500-1. The front-side source/drain contacts 254S1 and 254S3 of the front-side interconnect structure 260 are electrically connected to the epitaxial source/drain structures 240-1S1 and 240-2S2 of the isolation field-effect transistor device 500-3. In addition, the front-side source/drain contact 254S2 is electrically connected the to the epitaxial source/drain structure 240-2S1 of the field-effect transistor device 500-2. In some embodiments, the front-side gate contact 254G1 and the front-side source/drain contacts 254S1, 254S2 and 254S3 comprise copper (Cu), tungsten (W), aluminum (Al), titanium (T1), tantalum (Ta), cobalt (Co), and/or silicide. In some embodiments, the deposition process comprises chemical vapor deposition (CVD), plasma enhanced CVD (PECVD), physical vapor deposition, (PVD), atomic layer deposition (ALD) or other applicable deposition processes. In some embodiments, the planarization process comprises chemical mechanical polishing (CMP), etching back or a combination thereof.

Next, interconnect features 264S1, 264S2, 264S3 and 264G1 and an intermetal dielectric (IMD) layer 262 of the front-side interconnect structure 260 are formed on the interlayer dielectric (ILD) layer 242. The interconnect features 264S1, 264S2, 264S3 and 264G1 are formed in the intermetal dielectric (IMD) layer 262. The interconnect feature 264S1 is electrically connected to the front-side source/drain contact 254S1. The interconnect feature 264S2 is electrically connected to the front-side source/drain contact 254S2. The interconnect feature 264S3 is electrically connected to the front-side source/drain contact 254S3. The interconnect feature 264G1 is electrically connected to the front-side gate contact 254G1. In some embodiments, the intermetal dielectric (IMD) layer 262 comprises a composite layer formed of dielectric materials. In some embodiments, the processes and the materials for forming interlayer dielectric (ILD) layer 242 may be similar to, or the same as, those for forming the intermetal dielectric (IMD) layer 262. In some embodiments, the interconnect features 264S1, 264S2, 264S3 and 264G1 comprise vertical interconnect portions (which are vertical to the top surface 204T of the middle insulator layer 204), such as conductive vias, and horizontal interconnect portions (which are parallel to the top surface 204T of the middle insulator layer 204), such as conductive lines. In some embodiments, the processes and the materials for forming the front-side source/drain contacts 254S1, 254S2, 254S3 and the front-side gate contact 254G1 may be similar to, or the same as, those for forming the interconnect features 264S1, 264S2, 264S3 and 264G1. After performing the aforementioned processes, the front-side interconnect structure 260 comprising the interlayer dielectric (ILD) layer 242, the front-side gate contact 254G1, the front-side source/drain contacts 254S1, 254S2 and 254S3, the intermetal dielectric (IMD) layer 262 and the interconnect features 264S1, 264S2, 264S3 and 264G1 is completely formed. In addition, the number of intermetal dielectric (IMD) layer 262, the number of front-side gate contact 254G1, the number of front-side source/drain contacts 254S1, 254S2 and 254S3 and the number of interconnect features 264S1, 264S2, 264S3 and 264G1 shown in FIG. 8 are only an example and is not a limitation to the present disclosure.

Next, a front-side passivation layer 270 is formed on the front-side interconnect structure 260. The front-side passivation layer 270 is formed to protect the underlying front-side interconnect structure 260, field-effect transistor devices 500-1, 500-2 and isolation field-effect transistor device 500-3. In some embodiments, the front-side passivation layer 270 comprises silicon oxide, undoped silicate glass (USG), or other applicable dielectric materials. In some embodiments, the front-side passivation layer 270 is formed by a deposition process comprising chemical vapor deposition (CVD), physical vapor deposition, (PVD), or other applicable deposition processes.

Next, pads 272 and 274 are formed through the front-side passivation layer 270 and electrically connected to the front-side interconnect structure 270. For example, the pad 272 is electrically connected to the interconnect feature 264S2, and the pad 274 is electrically connected to the interconnect feature 264G1 of the front-side interconnect structure 270. In some embodiments, the pads 272 and 274 are provided electrical connections between the resulting semiconductor structure 550 and external circuits (not shown). In some embodiments, the pads 272 and 274 comprise copper (Cu), aluminum (Al), or other applicable conductive materials. In addition, the number of pads 272 and 274 shown in FIG. 8 is only an example and is not a limitation to the present disclosure.

Figure 9:
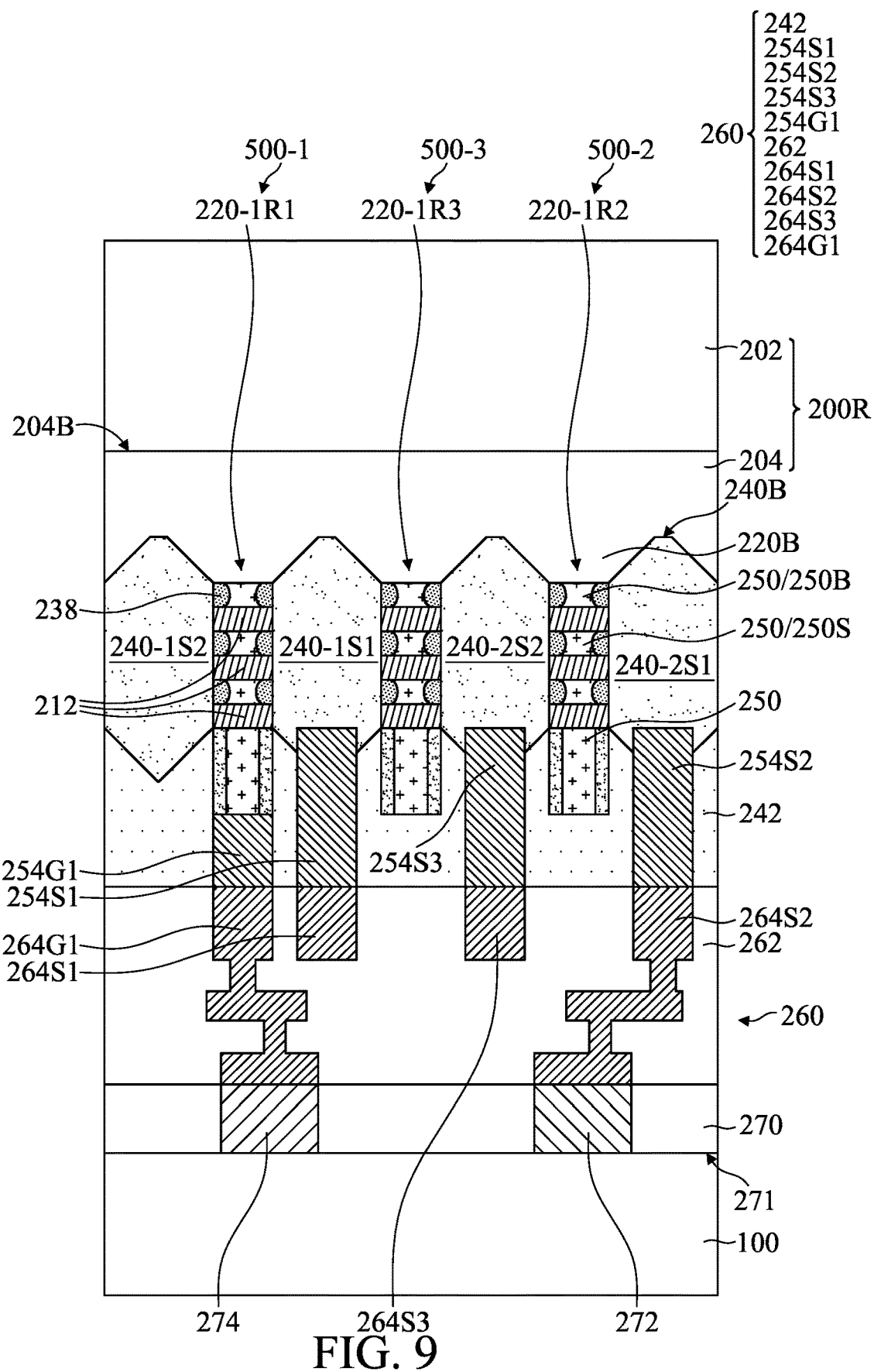

As shown in FIG. 9, next, a surface 271 of the front-side passivation layer 270 opposite the front-side interconnect structure 260 is mounted on a carrier 100. Next, the structure shown in FIG. 8 may be flipped upside down for backside processes shown in FIGS. 10-12.

Figure 10:
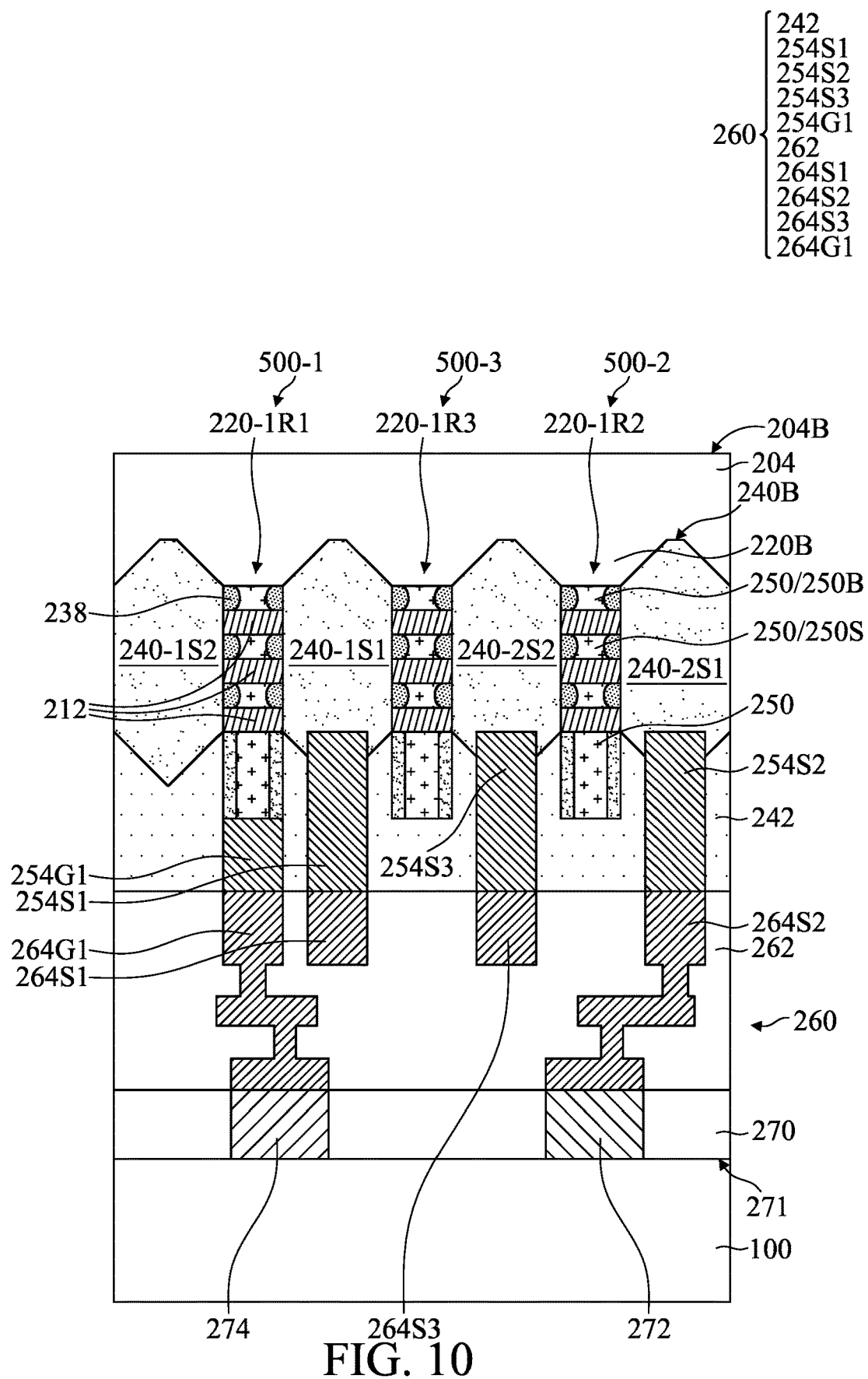

As shown in FIG. 10, next, the bottom substrate layer 202 (shown in FIG. 9) of the substrate 200R may be removed from the insulator layer 204 until the bottom surface 204B of the insulator layer 204 is exposed. In some embodiments, the bottom substrate layer 202 is removed by chemical mechanical polishing (CMP) or other applicable removal processes.

Figure 11:
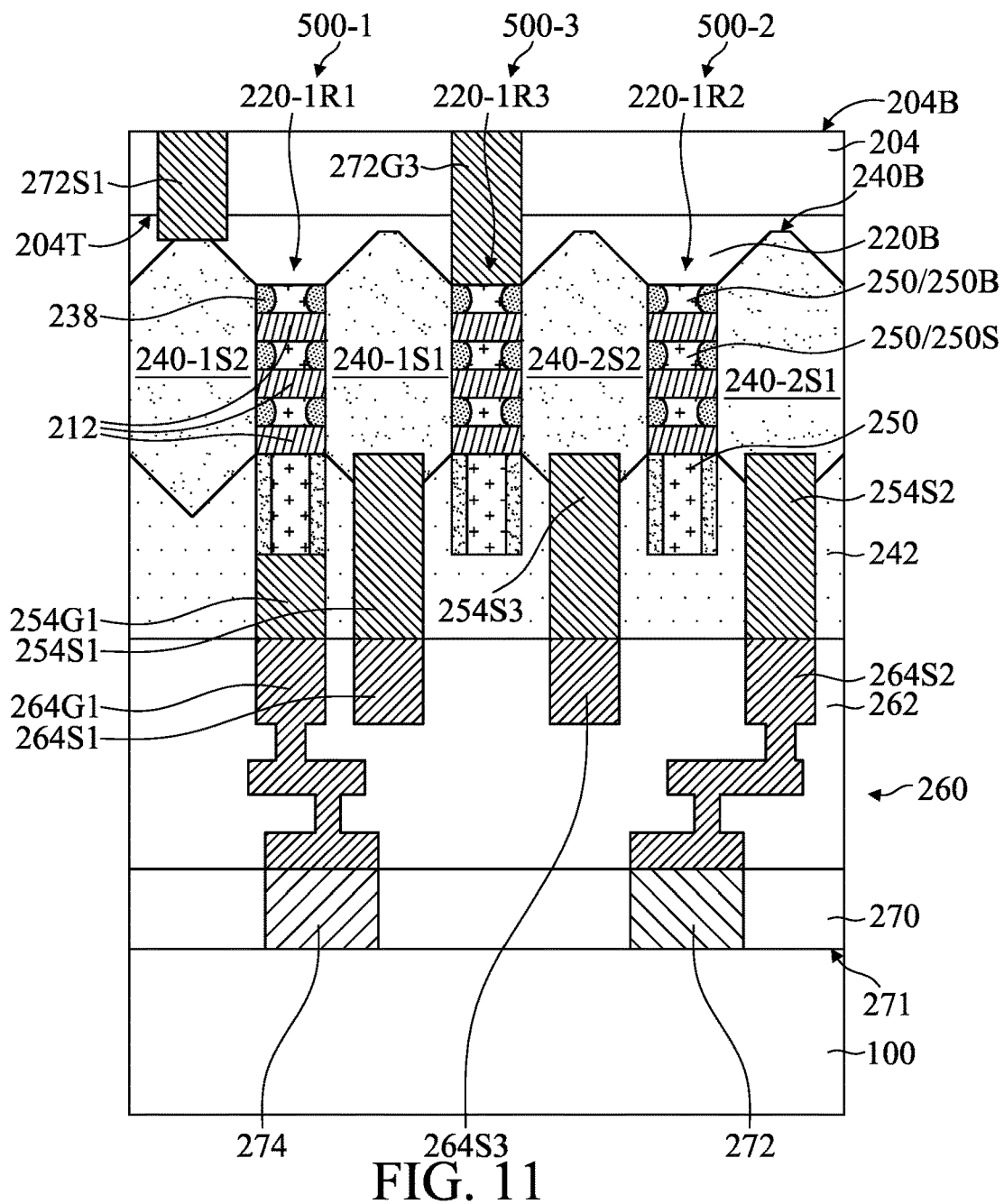

As shown in FIG. 11, next, a back-side gate contact 272G3 and a back-side source/drain contact 272S1 of a back-side interconnect structure 280 (shown in FIG. 12) are formed passing through the insulator layer 204. The back-side gate contact 272G3 is electrically connected to the bottom portion 250B of the gate structure 250 of the isolation field-effect transistor device 500-3. In addition, the back-side source/drain contact 272S1 is electrically connected to the bottom portion 240B of the epitaxial source/drain structure 240-1S2 of the field-effect transistor device 500-1. The back-side source/drain contact 272S1 may be electrically connected to a power circuit 282 (which comprises Vdd power lines and Vss power lines) shown in FIG. 12. Therefore, the back-side source/drain contact 272S1 may serve as the Vdd/Vss contact. In some embodiments, the processes and the materials for forming the back-side gate contact 272G3 and the back-side source/drain contact 272S1 may be similar to, or the same as, those for forming the front-side gate contact 254G1 and the front-side source/drain contacts 254S1, 254S2 and 254S3.

Figure 12:
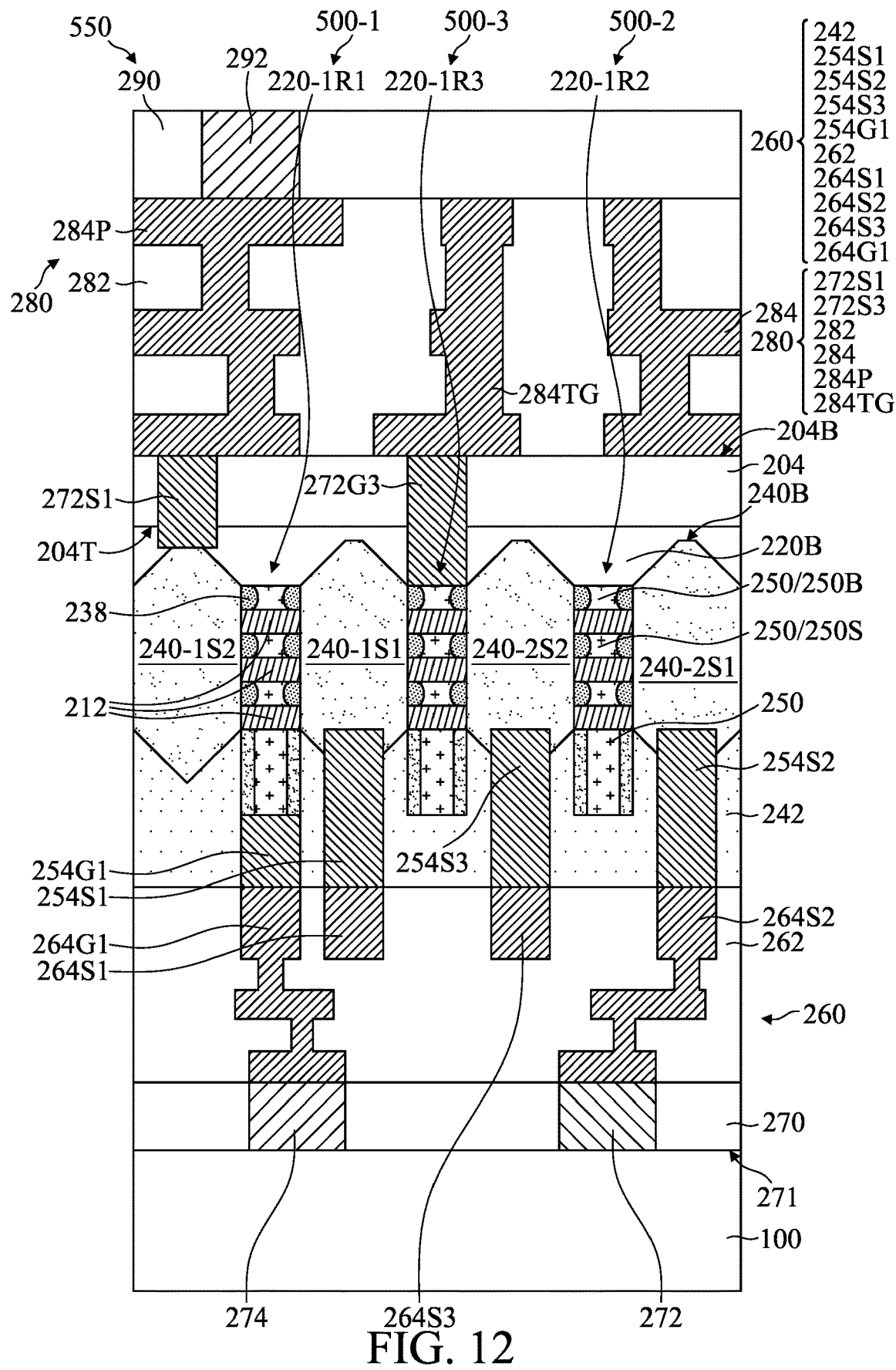

As shown in FIG. 12, next, a power circuit 284P, interconnect features 284TG and 284 and an intermetal dielectric (IMD) layer 282 of the back-side interconnect structure 280 are formed directly on the bottom surface 204B of the insulator layer 204. The power circuit 284P and the interconnect features 284TG and 284 are formed in the intermetal dielectric (IMD) layer 282. The power circuit 284P comprising Vdd power lines and Vss power lines (not shown) is disposed on the back-side surface 204B of the insulator layer 204 and electrically connected to the bottom portion 240B of the epitaxial source/drain structure 240-1S2 of the field-effect transistor device 500-1 by the back-side source/drain contact 272S1 passing through the insulator layer 204. Therefore, the power circuit 284P may serve as a back-side power mesh for the semiconductor structure 500. The interconnect feature 284TG is electrically connected to the bottom portion 250B of the gate structure 250 of the isolation field-effect transistor device 500-3 by the back-side gate contact 272G3 passing through the insulator layer 104. Therefore, the isolation field-effect transistor device 500-3 can be turned off by applying suitable voltages to the interconnect features 264S1, 264S3 of the front-side interconnect structure 260 and interconnect feature 284TG of the back-side interconnect structure 280. In addition, the interconnect feature 284 may be used as back-side routings for any of the field-effect transistor devices 500-1, 500-2 and the isolation field-effect transistor device 500-3. In some embodiments, the interconnect feature 284 can be electrically connected to the front-side source/drain contacts 254S1 and 254S3 of the front-side interconnect structure 260, so that the gate structure 250 and the epitaxial source/drain structures 240-1S1 and 240-2S2 of the isolation field-effect transistor device 500-3 can be electrically connected to the back-side interconnect structure 280. In some embodiments, the processes and the materials for forming the intermetal dielectric (IMD) layer 282 and the back-side source/drain contact 272S1 may be similar to, or the same as, those for forming the intermetal dielectric (IMD) layer 262. In some embodiments, the processes and the materials for forming the power circuit 284P and the interconnect features 284TG and 284 may be similar to, or the same as, those for forming the interconnect features 264S1, 264S2 and 264G1. After performing the aforementioned processes, the back-side interconnect structure 280 comprising the back-side gate contact 272G3, the back-side source/drain contact 272S1, the intermetal dielectric (IMD) layer 282 and the power circuit 284P and the interconnect features 284TG and 284 is completely formed. In some embodiments, the back-side interconnect structure 280 provides an additional routing area for the power circuit 284P, which is electrically connected to the epitaxial source/drain structure 240-1S2 of the field-effect transistor device 500-1, and interconnect features 284TG, which is electrically connected to the gate structure 250 of the isolation field-effect transistor device 500-3, disposed therein. Therefore, the area of the resulting semiconductor structure 550 can be further reduced. In addition, the number of intermetal dielectric (IMD) layer 282, the number of back-side gate contact 272G3, the number of back-side source/drain contact 272S1, the number of power circuit 284P and the number of interconnect features 284TG and 284 shown in FIG. 12 are only an example and is not a limitation to the present disclosure.

Next, a back-side passivation layer 290 is formed on the back-side interconnect structure 280. The back-side passivation layer 290 is formed to protect the underlying back-side interconnect structure 280, field-effect transistor devices 500-1, 500-2 and isolation field-effect transistor device 500-3. In some embodiments, the processes and the materials for forming the back-side passivation layer 290 may be similar to, or the same as, those for forming the front-side passivation layer 270.

Next, a pad 292 is formed through the back-side passivation layer 290 and electrically connected to the back-side interconnect structure 280. For example, the pad 292 is electrically connected to the power circuit 284P. The he pad 292 is provided an electrical connection between the resulting semiconductor structure 550 and external circuits (not shown). In some embodiments, materials for forming the pad 292 may be similar to, or the same as, those for forming the pads 272 and 274. In addition, the number of pad 292 shown in FIG. 12 is only an example and is not a limitation to the present disclosure. Next, the carrier 100 may be removed to form the semiconductor structure 550.

In some embodiments, the semiconductor structure 550 comprises the field-effect transistor devices 500-1, 500-2 and the isolation field-effect transistor device 500-3 formed on the middle insulator layer 204, which is formed from the SOI substrate 200. Each of the field-effect transistor devices 500-1, 500-2 and the isolation field-effect transistor device 500-3 comprises the fin structure 220-1R (which comprises the fin structures 220-1R1, 220-1R2 and 220-1R3) formed on insulator layer 204. Each of the fin structures 220-1R1, 220-1R2 and 220-1R3 comprises the channel layers 212 and the gate structure 250 that is wrapped around the channel layers 212. In addition, each of the fin structures 220-1R1, 220-1R2 and 220-1R3 comprises the epitaxial source/drain structures 240 connected to the channel layers 212. The isolation field-effect transistor device 500-3 interposed between the field-effect transistor devices 500-1 and 500-2 is kept in the off-state. The semiconductor structure 550 further comprises the front-side gate contact 254G1 formed on the field-effect transistor device 500-1 opposite the insulator layer 204. The front-side gate contact 254G1 is electrically connected the gate structure 250 of first field-effect transistor device 500-1. The semiconductor structure 550 further comprises the back-side gate contact 272G3 formed passing through the insulator layer 204 and electrically connected to the gate structure 250 of the isolation field-effect transistor device 500-3. Because the bottom portions 240B of the epitaxial source/drain structures 240 and the bottom portions 250B of the gate structures 250 of the field-effect transistor devices 500-1 and 500-2 are in contact with the middle insulator layer 204 of the substrate 200R. Therefore, the substrate leakage of the resulting semiconductor structure 550 can be eliminated without extra dopants implanted into bottoms of the gate structure and epitaxial source/drain structures. In addition, the isolation field-effect transistor device 500-3, which is kept in the off-state, can serve as an electrical isolation feature between the field-effect transistor devices 500-1 and 500-2 and have a reduced area than the conventional shallow trench isolation (STI) features. Further, the back-side interconnect structure 280 comprising back-side gate contact 272G3 provides an additional routing area for the routings (e.g. the interconnect feature 284TG) for the isolation field-effect transistor device 500-3 and the power circuit 284P for the field-effect transistor device 500-1 disposed therein. Therefore, the area of the resulting semiconductor structure 550 can be further reduced.

In the architecture of the GAA standard cell structure formed on a continuous active region (e.g., the semiconductor structure 500), the isolation field-effect transistor device 500-3 is designed to be interposed between the field-effect transistor devices 500-1 and 500-2 and controlled in the off-state by using the back-side gate contact 272G3 electrically connected to the gate structure 250 of the isolation field-effect transistor device 500-3. Since the GAA standard cell structure (e.g., the semiconductor structure 500) is designed to have the back-side power mesh (e.g., the power circuit 284P of the back-side interconnect structure 280), the gate structure 250 and the epitaxial source/drain structures 240-1S1 and 240-2S2 of the isolation field-effect transistor device 500-3 can be electrically connected to the back-side gate contact 272G3 and the interconnect feature 284 formed in the back-side interconnect structure 280. Therefore, the electrical connections (including the front-side gate contact 254G1 and the front-side source/drain contact 254S2) of the front-side interconnect structure 260 can be designed only for the field-effect transistor devices 500-1 and 500-2 (for signal transmission).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
an insulator layer;
a first field-effect transistor device, a second field-effect transistor device and an isolation field-effect transistor device between the first field-effect transistor device and the second field-effect transistor device formed on the insulator layer, wherein each of the first field-effect transistor device, the second field-effect transistor device and the isolation field-effect transistor device comprises:
a fin structure formed on the insulator layer, wherein the fin structure comprises channel layers and a gate structure that is wrapped around the channel layer; and
a first epitaxial source/drain structure and a second epitaxial source/drain structure connected to opposite sides of the channel layers, wherein the isolation field-effect transistor device is kept in an off-state;
a front-side gate contact formed on the first field-effect transistor device opposite the insulator layer, wherein the front-side gate contact is electrically connected to the gate structure of the first field-effect transistor device; and
a back-side gate contact formed passing through the insulator layer and electrically connected to the gate structure of the isolation field-effect transistor device.

2. The semiconductor structure as claimed in claim 1, wherein the first epitaxial source/drain structure of the isolation field-effect transistor device is the second epitaxial source/drain structure of the second field-effect transistor device, and the second epitaxial source/drain structure of the isolation field-effect transistor device is the first epitaxial source/drain structure of the first field-effect transistor device.

3. The semiconductor structure as claimed in claim 2, further comprising:
a front-side interconnect structure formed over a top surface of the insulator layer, wherein the front-side interconnect structure comprises the front-side gate contact; and
a back-side interconnect structure formed directly on a bottom surface of the insulator layer, wherein the back-side interconnect structure comprises the back-side gate contact.

4. The semiconductor structure as claimed in claim 3, further comprising:
a back-side source/drain contact of the back-side interconnect structure formed passing through the insulator layer and electrically connected to the second source/drain structure of the first field-effect transistor device.

5. The semiconductor structure as claimed in claim 4, wherein the back-side source/drain contact is electrically connected to a power circuit of the back-side interconnect structure.

6. The semiconductor structure as claimed in claim 4, wherein the first epitaxial source/drain structure and the second epitaxial source/drain structure of the isolation field-effect transistor device are electrically connected to the front-side interconnect structure.

7. The semiconductor structure as claimed in claim 3, further comprising:
a front-side passivation layer formed on the front-side interconnect structure;
a back-side passivation layer formed on the back-side interconnect structure; and a first pad formed through the front-side passivation layer and electrically connected to the front-side interconnect structure; and a second pad formed through the back-side passivation layer and electrically connected to the back-side interconnect structure.

8. The semiconductor structure as claimed in claim 3, wherein a bottom portion of each of the first epitaxial source/drain structure and the second epitaxial source/drain structure is in contact with the insulator layer.

9. The semiconductor structure as claimed in claim 1, wherein a bottom portion of the gate structure of each of the first field-effect transistor device and the second field-effect transistor device is in contact with the insulator layer.

10. The semiconductor structure as claimed in claim 1, wherein a first distance between a bottommost layer of the channel layers and the top surface of the insulator layer is the same as a second distance between the bottommost layer of the channel layers and the adjacent channel layer opposite to the insulator layer.

11. The semiconductor structure as claimed in claim 1, further comprising:
  inner spacers disposed on lateral ends of the gate structure, wherein the inner spacer in contact with the bottom portion of the gate structure is in contact with the insulator layer.

12. The semiconductor structure as claimed in claim 11, wherein the inner spacers in contact with the insulator layer are in contact with the bottommost layer of the channel layers.

13. The semiconductor structure as claimed in claim 1, wherein the fin structure comprises a base portion under the gate structure and the channel layers, wherein the base portion is formed from the insulator layer.

14. A semiconductor structure, comprising:
  a first field-effect transistor device and a second field-effect transistor device disposed side-by-side;
  an isolation field-effect transistor device interposed between the first field-effect transistor device and the second field-effect transistor device, wherein each of the first field-effect transistor device, the second field-effect transistor device and the isolation field-effect transistor device comprises:
    a fin structure comprising channel layers and a gate structure that is wrapped around the channel layer; and
    a first epitaxial source/drain structure and a second epitaxial source/drain structure connected to opposite sides of the channel layers;
  an insulator layer having a top surface in contact with a bottom portion of the gate structure of each of the first field-effect transistor device and the second field-effect transistor device;
  an interlayer dielectric (ILD) layer disposed on the gate structure of each of the first field-effect transistor device and the second field-effect transistor device;
  a back-side gate contact formed passing through the insulator layer and electrically connected to the bottom portion of the gate structure of the isolation field-effect transistor device; and
  a front-side source/drain contact formed passing through the interlayer dielectric (ILD) layer and electrically connected to the first epitaxial source/drain structure or the second epitaxial source/drain structure of the isolation field-effect transistor device.

15. The semiconductor structure as claimed in claim 14, wherein the isolation field-effect transistor device is kept in an off-state.

16. The semiconductor structure as claimed in claim 15, wherein the first epitaxial source/drain structure of the isolation field-effect transistor device is the second epitaxial source/drain structure of the second field-effect transistor device, and the second epitaxial source/drain structure of the isolation field-effect transistor device is the first epitaxial source/drain structure of the first field-effect transistor device.

17. The semiconductor structure as claimed in claim 15, further comprising:
  a power circuit disposed on a bottom surface the insulator layer and electrically connected to a bottom portion of the second source/drain structure of the first field-effect transistor device by a back-side source/drain contact passing through the insulator layer.

18. The semiconductor structure as claimed in claim 17, further comprising:
  a front-side interconnect structure formed over the top surface of the insulator layer, wherein the front-side interconnect structure comprises the interlayer dielectric (ILD) layer and the front-side source/drain contact; and
  a back-side interconnect structure formed directly on the bottom surface of the insulator layer, wherein the back-side interconnect structure comprises the power circuit and the back-side gate contact.

19. The semiconductor structure as claimed in claim 17, further comprising:
  a front-side gate contact of the front-side interconnect structure formed passing through the interlayer dielectric (ILD) layer, wherein the front-side gate contact is electrically connected to the gate structure of the first field-effect transistor device.

20. The semiconductor structure as claimed in claim 17, further comprising:
  a front-side passivation layer formed on the front-side interconnect structure;
  a back-side passivation layer formed on the back-side interconnect structure;
  a first pad formed through the front-side passivation layer and electrically connected to the front-side interconnect structure; and
  a second pad formed through the back-side passivation layer and electrically connected to the back-side interconnect structure.

21. The semiconductor structure as claimed in claim 14, wherein a bottom portion of each of the first epitaxial source/drain structure and the second epitaxial source/drain structure is in contact with the insulator layer.

22. The semiconductor structure as claimed in claim 14, wherein a bottom portion of the gate structure of each of the first field-effect transistor device and the second field-effect transistor device is in contact with the insulator layer.

23. The semiconductor structure as claimed in claim 14, wherein a first portion of the gate structure between a bottommost layer of the channel layers and the front-side of the insulator layer has a first thickness, a second portion of the gate structure between the bottommost layer of the channel layers and the adjacent channel layer opposite to the insulator layer has a second thickness, wherein the second thickness is the same as the first thickness.

24. The semiconductor structure as claimed in claim 14, further comprising:

inner spacers disposed on lateral ends of the gate structure, wherein the inner spacers on a bottom portion of the gate structure are in contact with the insulator layer.

25. The semiconductor structure as claimed in claim 14, wherein the fin structure comprises a base portion in contact with a bottom portion of the gate structure, wherein the base portion is formed from the insulator layer.

26. A method for forming a semiconductor structure, comprising:
    providing a substrate having a substrate layer and an insulator layer on the substrate layer;
    forming a first field-effect transistor device, a second field-effect transistor device and an isolation field-effect transistor device between the first field-effect transistor device and the second field-effect transistor device and directly on the insulator layer, wherein each of the first field-effect transistor device, the second field-effect transistor device and the isolation field-effect transistor device comprises:
        a fin structure formed on the insulator layer, wherein the fin structure comprises channel layers and a gate structure that is wrapped around the channel layer; and
        a first epitaxial source/drain structure and a second epitaxial source/drain structure connected to opposite sides of the channel layers, wherein the isolation field-effect transistor device is kept in an off-state;
    forming a front-side gate contact on the first field-effect transistor device opposite the insulator layer, wherein the front-side gate contact is electrically connected to the gate structure of the first field-effect transistor device;
    removing the substrate layer from the insulator layer; and
    forming a back-side gate contact passing through the insulator layer and electrically connected to the gate structure of the isolation field-effect transistor device.

27. The method for forming a semiconductor structure as claimed in claim 26, further comprising:
    forming a front-side interconnect structure over a top surface of the insulator layer before the removal of the substrate layer from the insulator layer, wherein the front-side interconnect structure comprises the front-side gate contact; and
    forming a front-side passivation layer on the front-side interconnect structure.

28. The method for forming a semiconductor structure as claimed in claim 27, further comprising:
    mounting a surface of the front-side passivation layer opposite the front-side interconnect structure on a carrier before the removal of the substrate layer from the insulator layer; and
    forming a back-side interconnect structure directly on a bottom surface of the insulator layer after the removal of the substrate layer from the insulator layer, wherein the back-side interconnect structure comprises the back-side gate contact; and
    forming a back-side passivation layer on the back-side interconnect structure.

29. The method for forming a semiconductor structure as claimed in claim 28, further comprising:
    forming a first pad through the front-side passivation layer and electrically connected to the front-side interconnect structure; and
    forming a second pad through the back-side passivation layer and electrically connected to the back-side interconnect structure.

30. The method for forming a semiconductor structure as claimed in claim 27, further comprising:
    forming front-side source/drain contacts of the front-side interconnect structure passing through the interlayer dielectric (ILD) layer and electrically connected to the first epitaxial source/drain structure and the second epitaxial source/drain structure of the isolation field-effect transistor device.

31. The method for forming a semiconductor structure as claimed in claim 30, wherein the first epitaxial source/drain structure of the isolation field-effect transistor device is the second epitaxial source/drain structure of the second field-effect transistor device, and the second epitaxial source/drain structure of the isolation field-effect transistor device is the first epitaxial source/drain structure of the first field-effect transistor device.

32. The method for forming a semiconductor structure as claimed in claim 26, wherein the substrate further comprises a top semiconductor layer containing first semiconductor atoms on the insulator layer, wherein forming the first field-effect transistor device, the second field-effect transistor device and the isolation field-effect transistor device comprises:
    epitaxially growing a semiconductor capping layer on the top semiconductor layer, wherein the semiconductor capping layer contains the first semiconductor atoms and second semiconductor atoms that are different from the first semiconductor atoms;
    performing a thermal process to drive the second semiconductor atoms of the semiconductor capping layer into the top semiconductor layer so that the semiconductor capping layer and the top semiconductor layer collectively form a first sacrificial layer;
    epitaxially growing a stack of alternating channel layers of the first field-effect transistor device, the second field-effect transistor device and the isolation field-effect transistor device and second sacrificial layers on the first sacrificial layer;
    patterning the middle insulator layer, the top semiconductor layer, the first sacrificial layer and the stack of alternating channel layers and second sacrificial layers to form an intermediate fin structure;
    removing portions of the intermediate fin structure until the middle insulator layer is exposed to form source/drain recesses;
    forming the first epitaxial source/drain structures and the second epitaxial source/drain structures of the first field-effect transistor device, the second field-effect transistor device and the isolation field-effect transistor device in the source/drain recesses;
    selectively removing the first sacrificial layer and the second sacrificial layers after forming the first epitaxial source/drain structures and the second epitaxial source/drain structures; and
    forming the gate structures of the first field-effect transistor device, the second field-effect transistor device and the isolation field-effect transistor device that are wrapped around the channel layers.

33. The method for forming a semiconductor structure as claimed in claim 32, wherein a first concentration of second semiconductor atoms in the semiconductor capping layer is greater than a second concentration of second semiconductor atoms in the first sacrificial layer.

34. The method for forming a semiconductor structure as claimed in claim 32, wherein the channel layers contain the first semiconductor atoms but not the second semiconductor atoms.

35. The method for forming a semiconductor structure as claimed in claim 32, wherein the second sacrificial layers contain the first semiconductor atoms and the second semiconductor atoms.

36. The method for forming a semiconductor structure as claimed in claim 32, wherein the first sacrificial layer has a first composition, and the second sacrificial layers have a second composition that is the same as the first composition.

37. The method for forming a semiconductor structure as claimed in claim 32, wherein the first sacrificial layer has a first thickness, and the second sacrificial layers have a second thickness, wherein the second composition is the same as the first thickness.

38. The method for forming a semiconductor structure as claimed in claim 36, wherein the channel layers have a third composition, and the third composition is different from the first composition and the second composition.

39. The method for forming a semiconductor structure as claimed in claim 32, wherein a bottommost layer of the channel layers is in contact with the first sacrificial layer after epitaxially growing the stack of alternating channel layers and second sacrificial layers.

40. The method for forming a semiconductor structure as claimed in claim 32, wherein the stack of alternating channel layers and second sacrificial layers comprises a first number of channel layers and a second number of second sacrificial layers, and the first number is greater than the second number.

41. The method for forming a semiconductor structure as claimed in claim 32, further comprising:
forming inner spacers on lateral ends of the first sacrificial layer and the second sacrificial layers after forming the source/drain recesses.

42. The method for forming a semiconductor structure as claimed in claim 32, wherein a first etch selectivity between the first sacrificial layer and the channel layers is the same as a second etch selectivity between the second sacrificial layer and the channel layers during the selective removal of the first sacrificial layer and the second sacrificial layers.

* * * * *